(12) United States Patent
Marutani

(10) Patent No.: US 7,795,925 B2
(45) Date of Patent: Sep. 14, 2010

(54) PHASE DIFFERENCE DETECTOR AND PHASE DIFFERENCE DETECTION METHOD

(75) Inventor: Masazumi Marutani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/432,426

(22) Filed: Apr. 29, 2009

(65) Prior Publication Data

US 2009/0267666 A1 Oct. 29, 2009

Related U.S. Application Data

(63) Continuation of application No. PCT/JP2006/322012, filed on Nov. 2, 2006.

(51) Int. Cl.
  *G01R 25/00* (2006.01)
  *H03D 13/00* (2006.01)
(52) U.S. Cl. .............. 327/3; 327/12; 327/151; 327/160; 324/76.77; 324/76.82; 702/72
(58) Field of Classification Search ............ 327/2, 327/3, 7, 9, 10, 12, 151, 160; 455/214; 324/76.77, 324/76.82; 702/72
See application file for complete search history.

(56) References Cited

U.S. PATENT DOCUMENTS 3,671,876 A * 6/1972 Oshiro ................ 327/7

6,528,982 B1 * 3/2003 Yanagisawa et al. ..... 324/76.77
6,628,276 B1 9/2003 Elliott
2007/0296396 A1 * 12/2007 Nakahira .................. 324/86

FOREIGN PATENT DOCUMENTS

JP 2001349911 12/2001
JP 2002076863 3/2002

OTHER PUBLICATIONS

Martin T. Hill and Antonio Cantoni, Precise All Digital Frequency Detector for High Frequency Signals, IEEE Transactions on Communications, vol. 48, No. 11, Nov. 2000, pp. 1937-1944.
International Search Report dated Nov. 28, 2006.

* cited by examiner

*Primary Examiner*—Lincoln Donovan
*Assistant Examiner*—Patrick O'Neill
(74) *Attorney, Agent, or Firm*—Hanify & King, PC

(57) ABSTRACT

A phase difference detector for detecting a phase difference between input clocks which both have a same first frequency, including: a pulse width conversion unit for converting the input clocks into a phase difference signal indicating by a pulse width a phase difference between the input clocks; and a counter unit which samples a level of the phase difference signal using a reference clock having a second frequency which is slower than the first frequency, and counts the number of levels of the phase difference signal using a first weighting according to the sampled level of the phase difference signal. When the count value of the counter unit transits in a predetermined range, the phase difference between the input clocks is detected according to the first weighting.

9 Claims, 20 Drawing Sheets

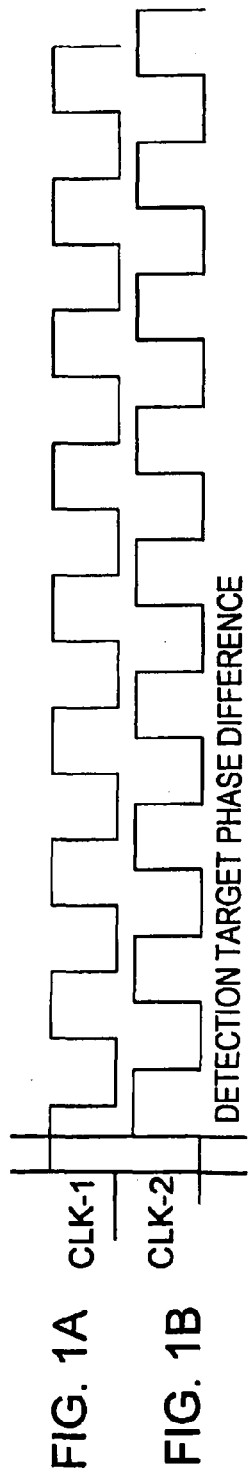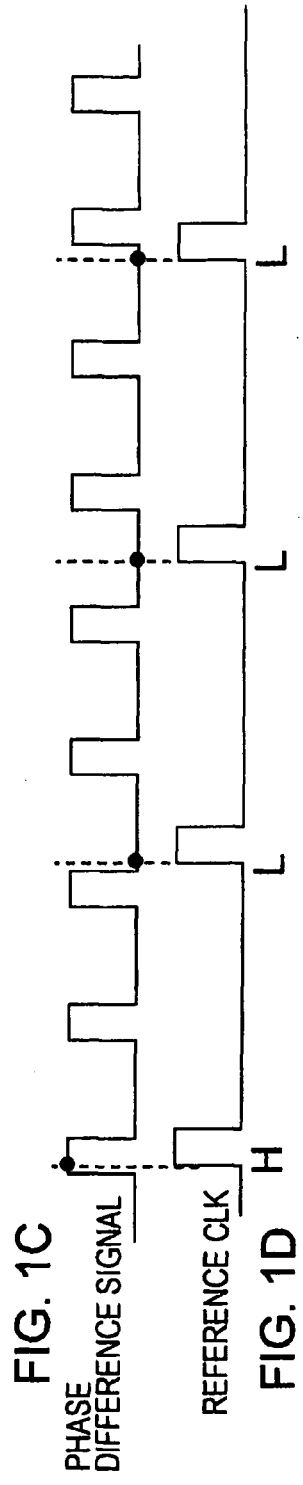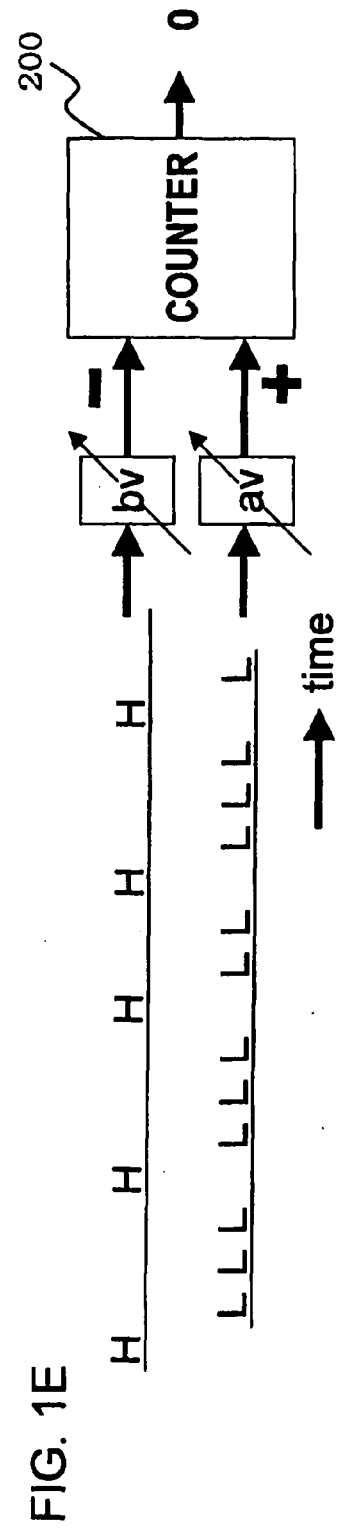

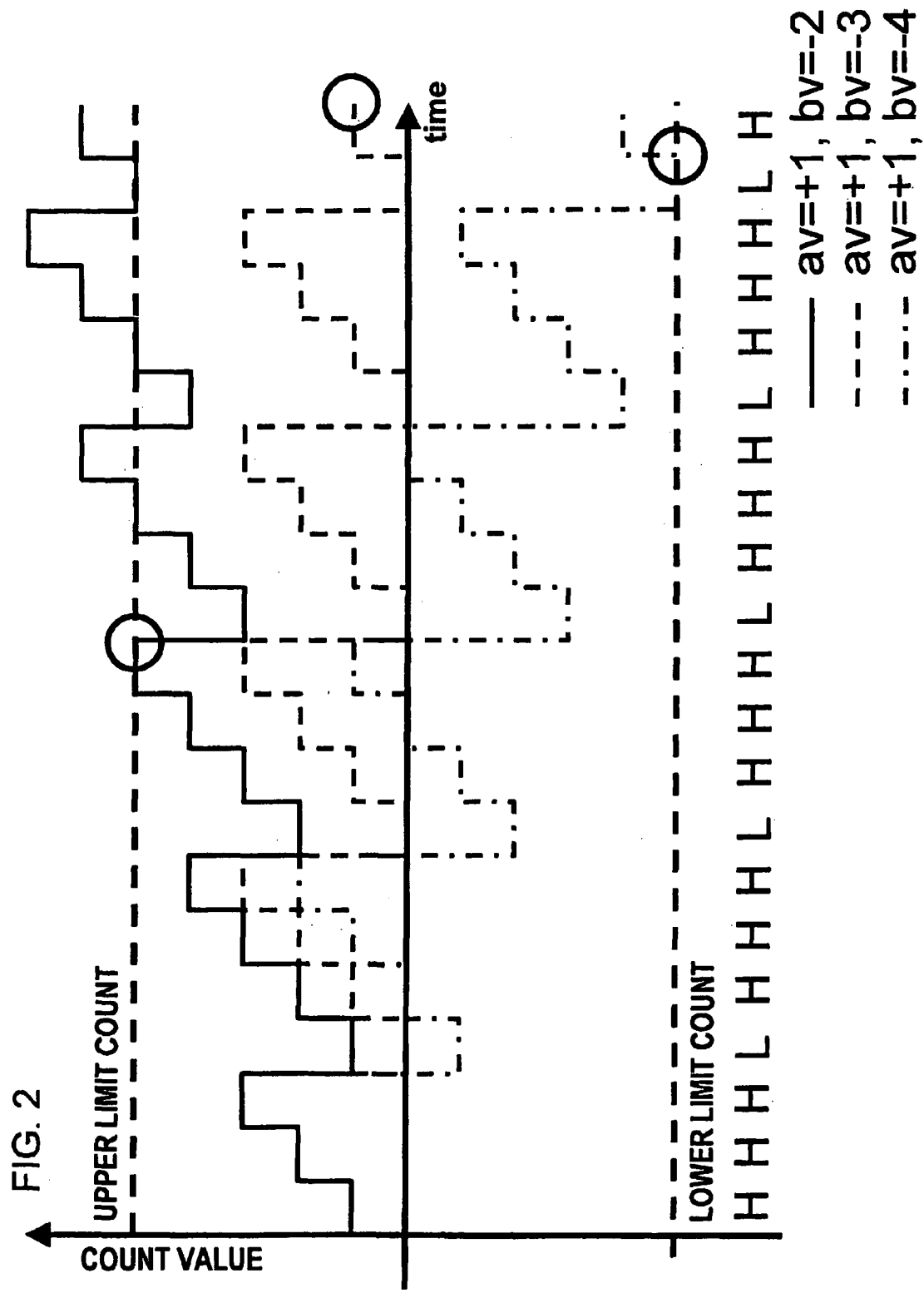

FIG. 18A
| INPUT 1 | INPUT 2 | OR PULSE WIDTH [CYCLE] | AND PULSE WIDTH [CYCLE] |
|---|---|---|---|
| 0° CLK | 90° CLK | 0.75 | 0.25 |
| 0° CLK | 180° CLK | 1 | 0 |
| H FIXED | 0° CLK | 1 | 0.5 |
↑ FOR DUTY DETECTION
FIG. 18B
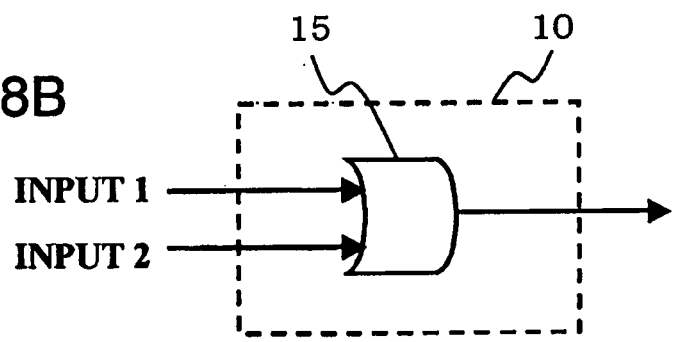
FIG. 18C
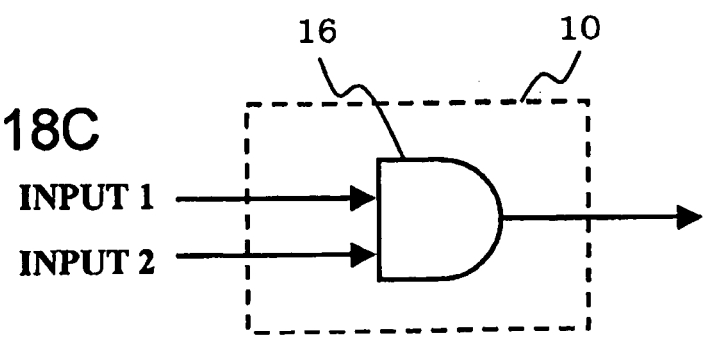

TARGET 90°

ACTUALLY 88? 89? 90? 91? 92? . . .

COUNT M NUMBER OF REFERENCE CLOCKS

US 7,795,925 B2

PHASE DIFFERENCE DETECTOR AND PHASE DIFFERENCE DETECTION METHOD

CROSS-REFERENCE TO RELATED APPLICATIONS

This application is a continuation of international application PCT/JP2006/322012, filed on Nov. 2, 2006.

TECHNICAL FIELD

The present invention relates to a phase difference detector detecting a phase difference between clocks that can be integrated on a semiconductor, and more particularly to a phase difference detector and phase difference detection method for detecting a phase difference accurately using a clock of which frequency is slower than the input clock.

BACKGROUND ART

Lately the trend to implement higher functions and a higher degree of integration is progressing, and it is becoming necessary to integrate various functions on one chip. Some of these electronic integrated circuits are used for detecting or correcting the duty ratio (ratio of L or H in one cycle) of a signal using a multi-phase clock.

A multi-phase clock can be generated by disposing a ring type oscillator which forms a ring type loop of multi-stage amplification circuits, and/or disposing a dividing circuit in a subsequent stage of the clock source. In this configuration, however, the generated multi-phase clock may deviate from an ideal phase relationship because of the dispersion of characteristics or the like in such a device as a transistor on a circuit.

Therefore the challenges in such an electronic integrated circuit are to search for a cause of the shift of the phase relationship by accurately detecting the phase difference and generating a desired phase difference.

FIG. 19 and FIG. 20 are diagrams depicting an example of prior art for detecting a phase difference.

For example, a case of detecting a phase difference of two measurement target clocks, as shown in FIG. 19A, is considered. In this case, as FIG. 19B shows, the phase difference can be detected by using a reference clock having a sufficiently faster frequency (or shorter cycles) than the frequencies of the measurement target clocks, and counting the clock count of the reference clock (e.g. beginning of Non-patent Document 1).

On the other hand, as shown in FIG. 20, the phase difference of the two measurement target clocks can also be detected by mixing the reference clock and the two measurement target clocks respectively by mixers 151 and 152, adding the results by an adder 154, and detecting this output signal by such an external measurement device as an oscilloscope.

Non-patent Document 1: Precise All Digital Frequency Detector for High Frequency Signals, Martin T. Hill and Antonio Cantoni, IEEE Transactions on Communications, Vol. 48, No. 11, November 2000, pp. 1937 to 1944

If a high-speed reference clock is used, however, such a circuit as a counter, to count the clock count, must also be operated at high-speed. Therefore the use of a high-speed reference clock often becomes an impractical demand, and with which the phase difference of the input clocks cannot be detected accurately.

Also the external measurement device that is used for detecting the output signal cannot be used for application to detect the phase difference by the phase difference detector integrated in the semiconductor. This requires an additional cost.

DISCLOSURE OF THE INVENTION

With the foregoing in view, it is an object of the present invention to provide a phase difference detector and phase difference detection method which can detect the phase difference of the input clocks accurately using a reference clock of which frequency (or cycle) is slower than the input clocks.

MEANS FOR SOLVING THE SUBJECTS

To achieve the above objects, one mode of the present invention provides a phase difference detector for detecting a phase difference between input clocks which both have a same first frequency, including: a pulse width conversion unit for converting the input clocks into a phase difference signal indicating by a pulse width a phase difference between the input clocks; and a counter unit which samples a level of the phase difference signal using a reference clock having a second frequency which is slower than the first frequency, and counts the number of levels of the phase difference signal using a first weighting according to the sampled level of the phase difference signal, wherein when the count value of the counter unit transits in a predetermined range, the phase difference between the input clocks is detected according to the first weighting.

Also, according to the other mode of the present invention, the pulse width conversion unit includes a NOT circuit which inverts a logic of one of the input clocks, and an AND circuit which computes AND of the one of the input clocks inverted by the NOT circuit and the other of the input clocks, and output of the AND circuit is the phase difference signal.

Also, according to the other mode of the present invention, the counter unit calculates the count value using a second weighting, which corrects the count value, and the first weighting, and an adjusted phase difference between the input clocks is detected according to the second weighting.

Also, according to the other embodiment of the present invention, the counter includes sampling units each of which samples a level of the phase difference signal respectively, and a fixed potential in place of the phase difference signal is input to one of the sampling units.

Also, according to the other mode of the present invention, the counter unit includes a plurality of transistors, a constant current source and a comparator, and the first or second weighting is input by the plurality of transistors and the constant current source and the count value is output, and the comparator outputs a value to show whether the count value transits within the predetermined range.

Also, according to the other mode of the present invention, the phase difference detector further includes a phase adjustment unit which adjusts a phase difference of the input clocks to be a target phase difference according to the output of the counter unit.

Also, according to the other mode of the present invention, the phase difference detector further includes a dividing adjustment unit which counts a continuous appearance count of one of the levels of the phase difference signal, and divides the reference clock when the continuous appearance count value exceeds a maximum allowable continuous appearance count.

Also, according to the other mode of the present invention, the pulse width conversion unit includes an AND circuit to which the input clocks are input and which computes AND, and a fixed level is input to one of inputs of the AND circuit.

To achieve the above-described object, the other mode of the present invention provides a phase difference detection method for detecting a phase difference between input clocks which both have a same first frequency, the method including: converting the input clocks into a phase difference signal indicating by a pulse width a phase difference between the input clocks; sampling a level of the phase difference signal using a reference clock having a second frequency which is slower than the first frequency and counting the number of levels of the phase difference using a first weighting according to the sampled level of the phase difference signal; and detecting the phase difference between the input clocks according to the first weighting when the counted count value transits within a predetermined range.

According to the present invention, a phase difference detector and phase difference detection method, which can detect the phase difference of the input clocks accurately using a reference clock of which frequency (or cycle) is slower than the input clocks, can be provided.

BRIEF DESCRIPTION OF DRAWINGS

FIG. 1A and FIG. 1B show an example of two input clocks, FIG. 1C shows an example of the converted phase difference signal, FIG. 1D shows an example of the reference clock, and FIG. 1E shows an example of the counter.

FIG. 2 is a diagram depicting the transition of the count values.

FIG. 18A shows an example of input/output of the phase difference-pulse width conversion circuit, and FIGS. 18B and 18C show a configuration example of the phase difference-pulse width conversion circuit.

BEST MODE FOR CARRYING OUT THIS EMBODIMENT

Figure 3:
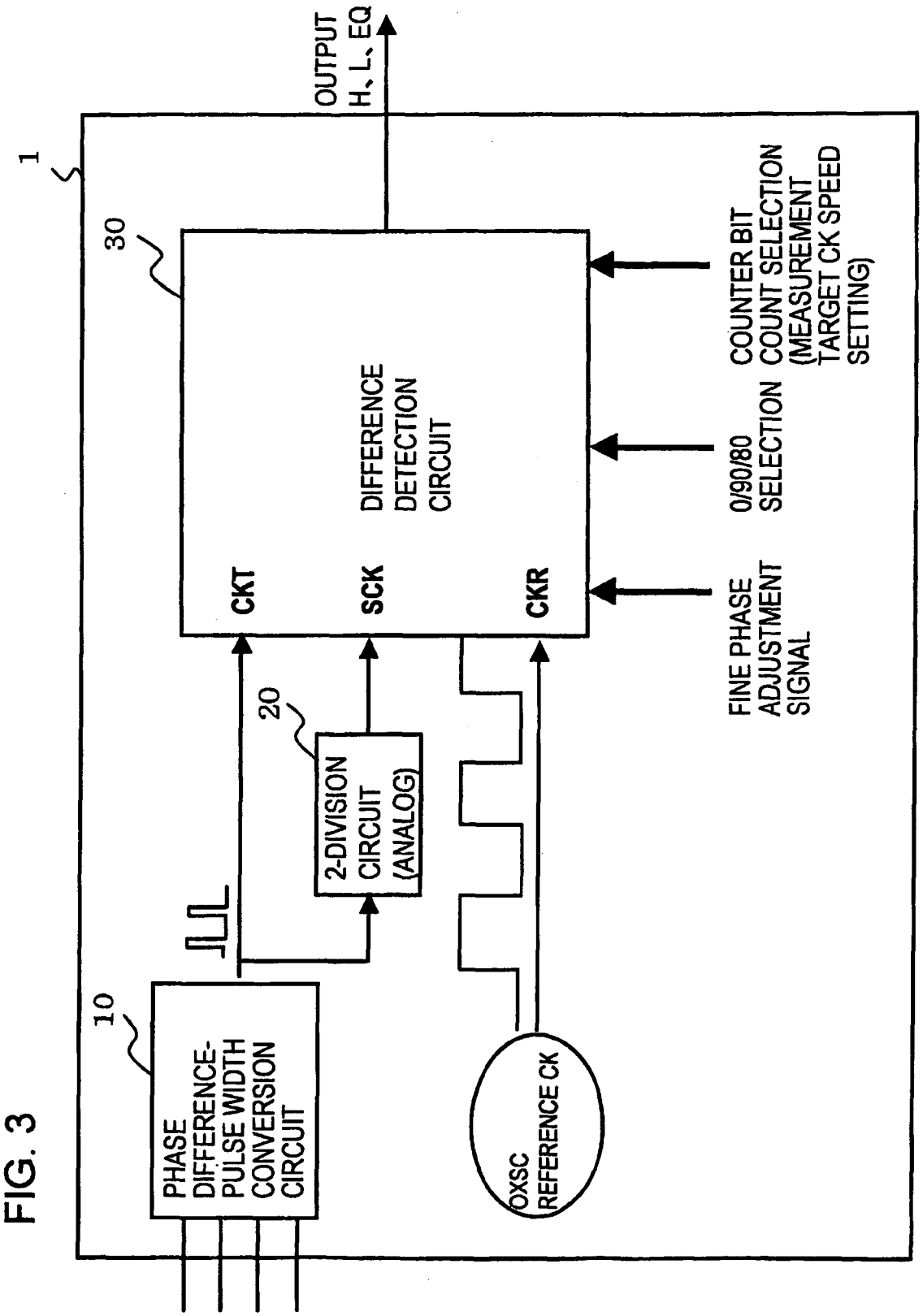
FIG. 3 is a diagram depicting a configuration example of a phase difference detection circuit.

Best mode for carrying out this embodiment will be now explained.

Concept of the Embodiment

The concept of the present embodiment will be described with reference to FIG. 1 and FIG. 2. FIG. 1A and FIG. 1B show an example of two input clocks (CLK-1, CLK-2) which are detection targets. The purpose is to detect the phase difference of the two input clocks (CLK-1, CLK-2). The frequencies of the two input clocks (CLK-1, CLK-2) are the same.

First the phase difference of the two input clocks (CLK-1, CLK-2) is converted into a phase difference signal indicating the phase difference between the two input clocks (CLK-1, CLK-2) by the pulse width thereof. FIG. 1C shows an example of the converted phase difference signal.

"H" and "L" of this phase difference signal are sampled using a reference clock of which frequency is slower than the frequency of the two input clocks (CLK-1, CLK-2). FIG. 1D shows an example of the reference clock (reference CLK). For the sampling, "H" is sampled when the phase difference signal is "H", and "L" is sampled when the phase difference signal is "L" at the rise of the reference clock respectively, as shown in FIG. 1D.

An appearance ratio of the sampled "H" and "L" matches an occurrence ratio (duty ratio) of "H" and "L" of the phase difference signal in the long run. The phase difference signal indicates the phase difference of the two input clocks (CLK-1, CLK-2) by its pulse width, and if the appearance ratio of "H" and "L" of the phase difference signal can be detected, then the phase difference of the two input clocks (CLK-1, CLK-2) can be detected.

For example, if the phase difference of the two input clocks (CLK-1, CLK-2) is exactly "90°", then the appearance ratio of the sampled "H" and "L" (appearance ratio of "H" and "L" of the phase difference signal) is "1:3".

In the present embodiment, as shown in FIG. 1E, a value with a certain weighting is added to the counter circuit 200 every time the sampled "H" or "L" appears. For example, if "H" is input, weighting value "b=−3" is added, and if "L" is input, "a=1" is added.

FIG. 2 is a diagram depicting the transition of the count values. In the counter circuit 200, the count value repeats increase and decrease, and transits to a value around "0" without overflow after a long time period elapses. In this case, the phase difference of the two input clocks (CLK-1, CLK-2) becomes "90°". Therefore if the weighting values "av" and "bv" can be correctly detected, the phase difference of the input clocks can be accurately detected.

If the weighting values "av" and "bv" and the appearance probability of the sampled "H" and "L" are actually shifted, the count value exceeds the upper limit count or lower limit count, as shown in the dotted line and dash and dotted line in FIG. 2. If the values "av" and "bv" are changed until the value "av" and "cv" correspond to the phase difference correctly (until the output of the counter circuit 200 becomes "0") when the upper or lower limit count is exceeded, the phase difference of the input clocks (CLK-1, CLK-2) can be accurately detected.

(Configuration and Operation of Phase Difference Detector)

Now the configuration and operation of a phase difference detection circuit (phase difference detector) will be described with reference to FIG. 3 to FIG. 8. FIG. 3 is a diagram depicting a configuration example of a phase difference detection circuit 1.

As FIG. 3 shows, the phase difference detection circuit 1 has a phase difference-pulse width conversion circuit 10, a two-division circuit 20, and a difference detection circuit 30.

The phase difference-pulse width conversion circuit 10 converts the input clocks into a phase difference signal in which the phase difference of the input clocks is indicated by a pulse width, and outputs it. This will be described in detail later.

The two-division circuit 20 divides the phase difference signal in half frequency, and outputs a phase difference signal of which duty is approximately "50%". Dividing the signal like this is to prevent a case of the difference detection circuit 30 in the subsequent stage not to operate, since the duty of the phase difference signal is too low. Needless to say, the dividing ratio may be "3", "4" or the like.

The difference detection circuit 30, to which the phase difference signal which was output from the phase difference-pulse width conversion circuit 10 and a reference clock of which frequency is slower than the frequency of the input clocks, are input, and detects the phase difference of the input clocks.

The difference detection circuit 30 can selects a predetermined phase difference ("0°", "90°" or "180°"), and a signal which indicates this phase difference (rough phase adjustment signal) is input to the difference detection circuit 30. This signal corresponds to the above mentioned weighting values "av" and "bv".

A fine phase adjustment signal and a signal for selecting a counter bit count (error compensation period adjustment signal) are input to the difference detection circuit 30. By performing fine adjustment on the phase difference selected by the rough phase adjustment signal, using these two signals, a phase difference, such as "88°" can be detected.

The difference detection circuit 30 outputs a value corresponding to a shift ("H", "L", "EQ") from a predetermined phase difference, so the phase difference of the input clocks can be accurately detected by adjusting the rough and fine phase adjustment signals and so.

Figure 4A:
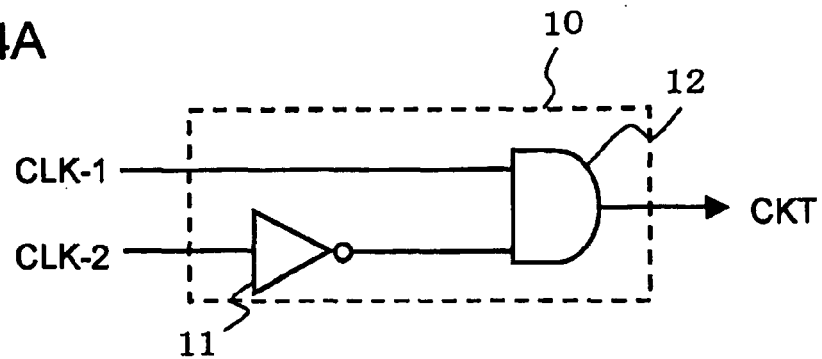
FIG. 4A and FIG. 4B are diagrams depicting the configuration examples of phase difference-pulse width conversion circuit.
Figure 4B:
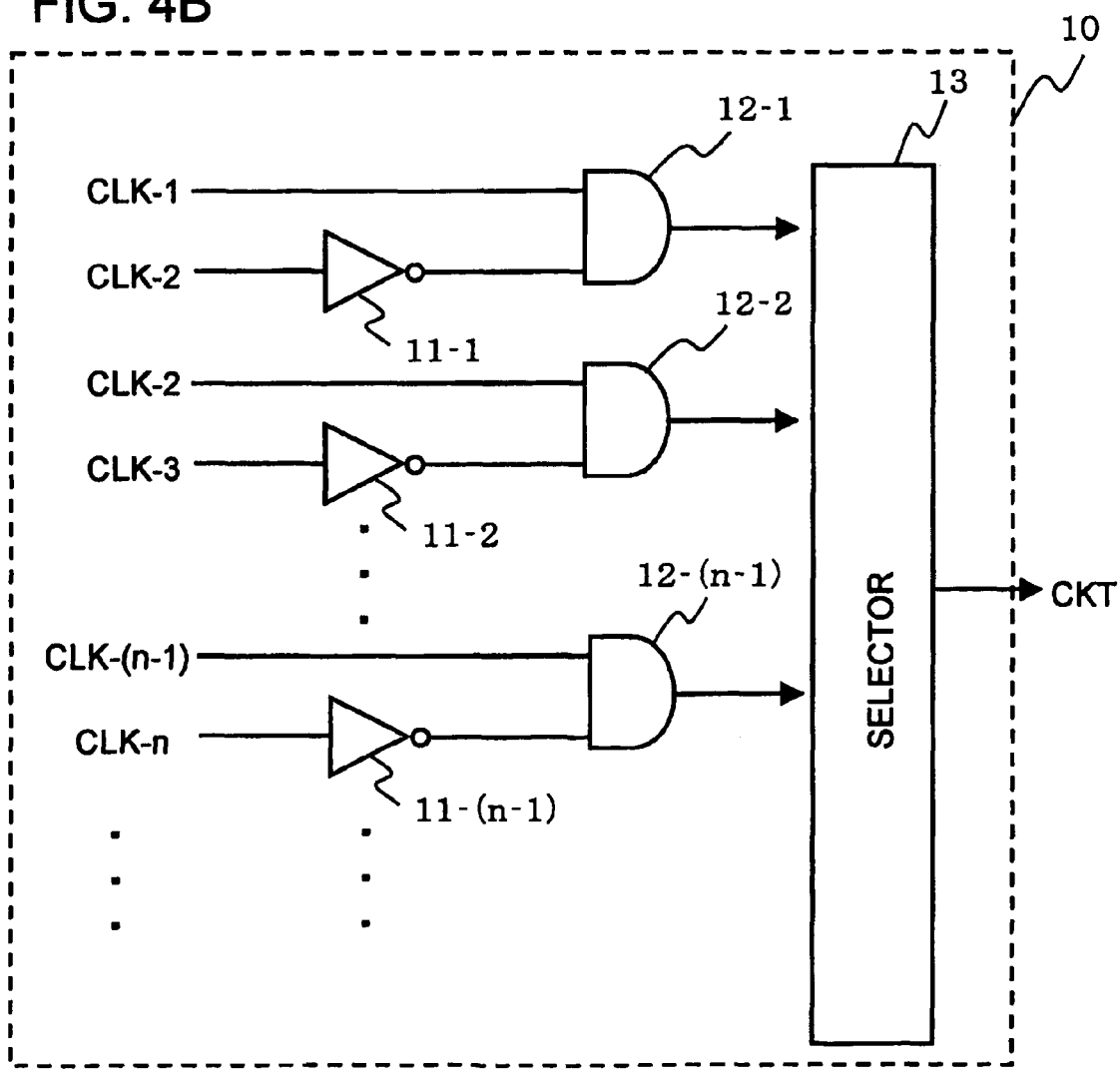

Now a detailed configuration of the phase difference-pulse width conversion circuit 10 will be described. FIG. 4A and FIG. 4B are diagrams depicting the configuration examples, where the former is a case of two inputs, and the latter a case of multi-phase input, respectively.

As FIG. 4A shows, the phase difference-pulse width conversion circuit 10 in the case of two inputs has a NOT circuit 11 and an AND circuit 12. One input clock (CLK-2 in the example of FIG. 4A) is inverted by the NOT circuit 11, and the AND circuit 12 performs AND operation of the other input clock CLK-1 and the inverted input clock/CLK-2.

For example, the input clock (CLK-2) shown in FIG. 1B is inverted, and AND with the input clock (CLK-1) shown in FIG. 1A is determined, whereby the phase difference signal shown in FIG. 1C is obtained. A phase shift signal having a pulse width corresponding to the phase difference of the two input clocks can be obtained.

FIG. 4B is a configuration example of the phase difference-pulse width conversion circuit 10 in the case of multi-phase input. The number of input clocks is "n".

The phase difference-pulse width conversion circuit 10 of the present example has a plurality of NOT circuits 11-1 to 11-n, . . . , a plurality of AND circuits 12-1 to 12-n, . . . , and a selector 13.

Inputs are all combinations of the input clocks, the NOT circuits 11-1 to 11-n, . . . and the AND circuits 12-1 to 12-n, are constructed for each input respectively, and output is selected by the selector 13 in the subsequent stage. For selection, the AND output of a combination of the target input clocks, for example, is selected.

The multi-phase input phase difference-pulse width conversion circuit 10 can be implemented by the configurations shown in FIG. 4A or FIG. 4B.

Figure 5:
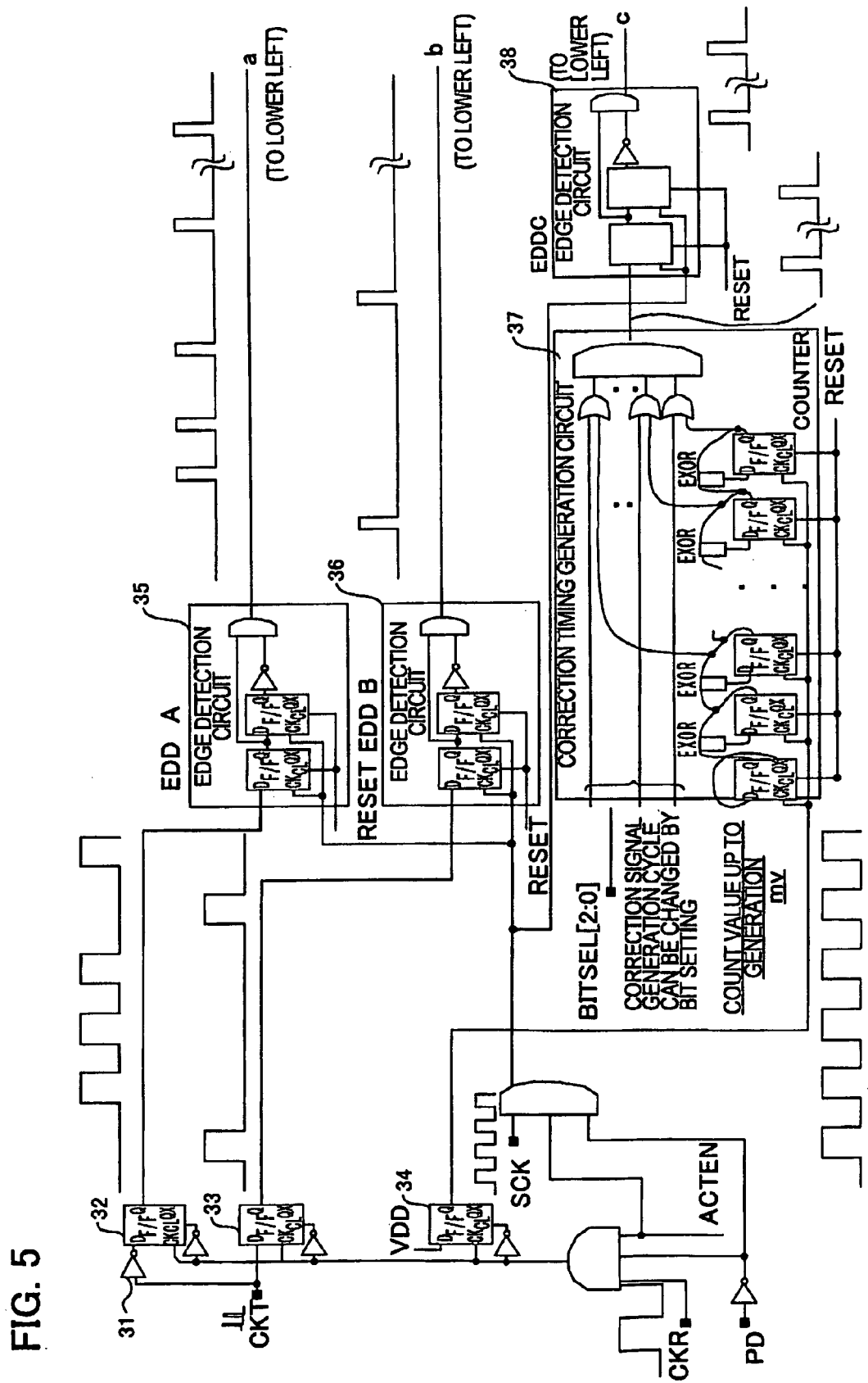
FIG. 5 shows a configuration example of a first stage portion of the difference detection circuit.
Figure 6:
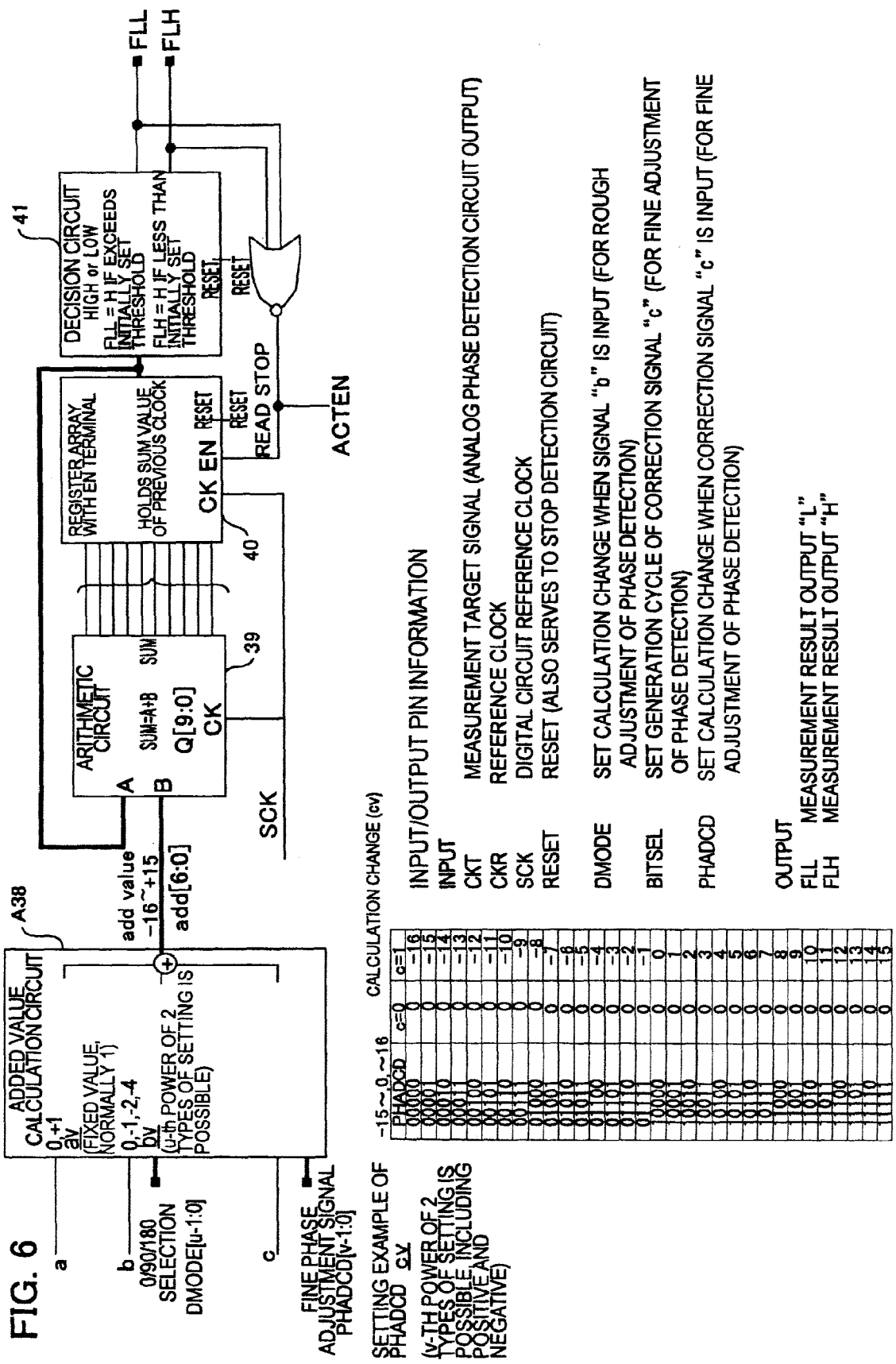
FIG. 6 shows a configuration example of a post stage portion of the difference detection circuit.
Figure 7:
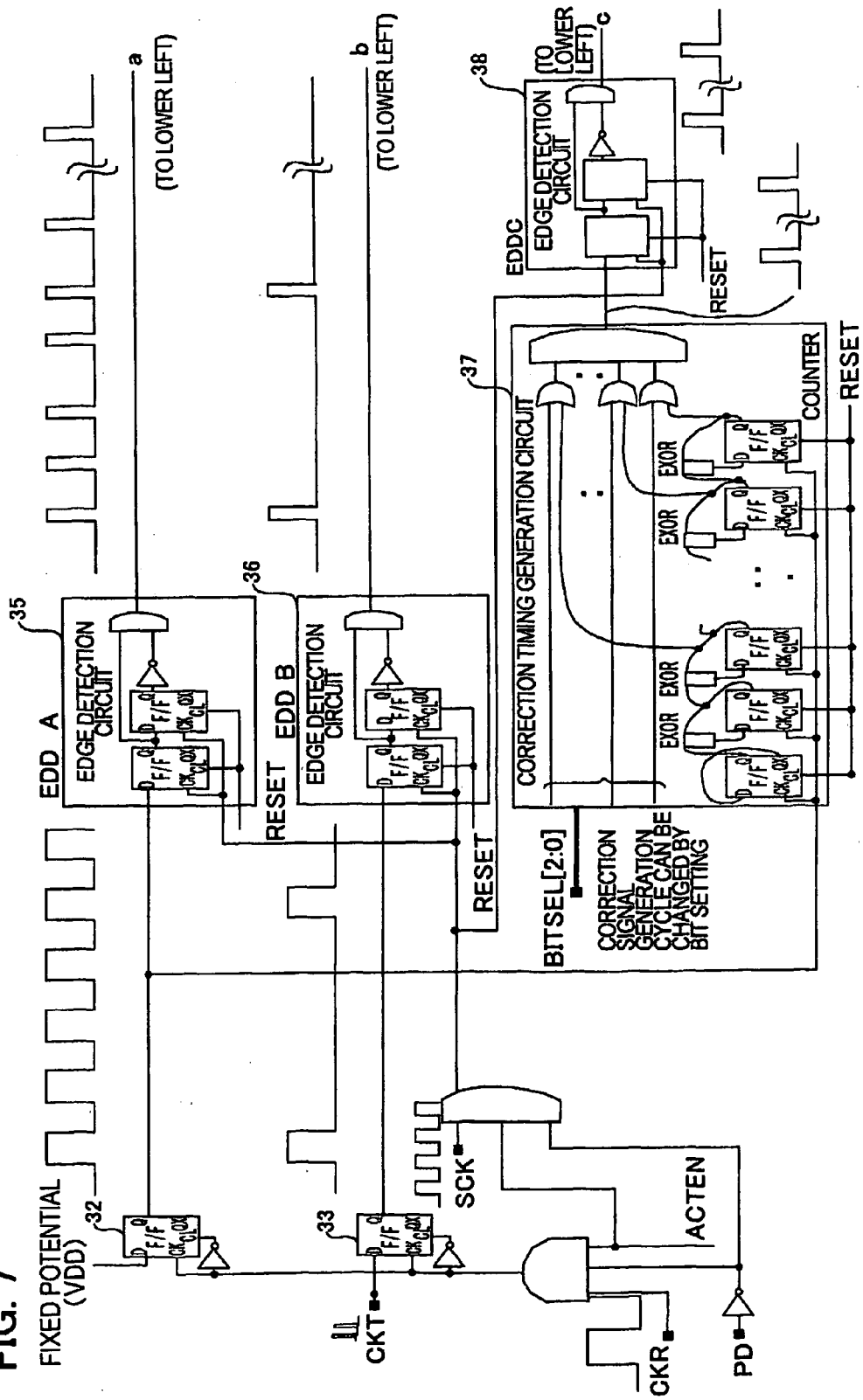
FIG. 7 shows another configuration example of a first stage portion of the difference detection circuit.

Now a detailed configuration of the difference detection circuit 30 will be described. FIG. 5 to FIG. 7 are diagrams depicting configuration examples of the difference detection circuit 30. FIG. 5 shows a configuration example of a first stage portion of the difference detection circuit 30, FIG. 6 shows a configuration example of a post stage portion of the difference detection circuit 30, and FIG. 7 shows another configuration example of a first stage portion of the difference detection circuit 30.

Now the first stage portion of the difference detection circuit 30 shown in FIG. 5 will be described. The pre-stage portion of the difference detection circuit 30 comprises an inverting circuit 31, first to third flip-flops 32 to 34, first, second and third edge detection circuits (which also serve as clock domain cross-overs) 35, 36, 38, and correction timing generation circuit 37. The clock domain cross-overs means that the output pulse strings of the flip-flops 32, 33 and 34 are synchronized with the CKR signal, on the other hand, the output pulse strings of the edge detection circuits 35, 36 and 38 are synchronized with the SCK signal.

CKT at the left end is a phase difference signal which is output from the phase difference-pulse width conversion circuit 10. When the phase difference signal CKT is input, the first and second flip-flops 32 and 33 output a signal which indicates "H" or "L" (see FIG. 1D) sampled with a reference clock. CKR For example, a clock sampled when the phase difference signal is "L" at the rise of the reference clock CKR is output from the first flip-flop 32, and a clock sampled when the phase difference signal is "H" is output from the second flip-flop 33.

However a signal of which logic is inverted is output from the first flip-flop 32 because of the inverting circuit 31 in the input stage of the first flip-flop 32. Hence output signals which are exclusive from each other are output from the first and second flip-flops 32 and 33.

The signal which is output from the first flip-flop 32 corresponds to "L" in FIG. 1E, and the signal which is output from the second flip-flop 33 corresponds to "H" in FIG. 1E.

CKR at the left end is the reference clock, with which the first to third flip-flops 32 to 34 synchronize and operate. As mentioned above, this reference clock CKR is a clock of which frequency is slower than the input clocks (and phase difference signal CKT).

From the third flip-flop 34, a signal corresponding to OR of the signals, which are output from the first and second flip-flops 32 and 33, is output.

The first and second edge detection circuits 35 and 36 and the third edge detection circuit 38 are circuits for synchronizing all the output signals from the first to third flip-flops 32 to 34 and correction timing generation circuit 37 with a common SCK signal. The output signal (signal c) of the correction timing generation circuit 37 and output signals (signal a, signal b) having phase difference information are output from the third edge detection circuit 38 and the first and second edge detection circuits 35 and 36 respectively. Clock SCK, for which the phase different signal CKT is divided into ½ frequency of the two input clocks (CLK-1, CLK-2) by the two-division circuit 20 are input to the clock input terminals of these circuits 35, 36 and 38 as the timing clock.

The signal a, out of the output signals, is a signal indicating that the phase difference signal becomes "L" when the phase difference signal is sampled by the reference clock, and the signal b indicates that the phase difference signal becomes "H". The signal c indicates a timing to correct the signal a and signal b.

A BITSEL signal as a count value (mv) up to correction timing generation is input to the correction timing generation circuit 37 from the left end. The BITSEL signal corresponds to an error synchronization compensation signal for selecting the counter bit count in FIG. 3. By the BITSEL signal, a cycle to output the signal c (generate a pulse signal) is set.

The count value mv up to correction timing generation is a count value at which the signal c is output from the correction timing generation circuit 37 (e.g. pulse signal which transmits as "0-1-0"). For example, if the correction timing generation circuit 37 is constructed with a "5-bit" counter, then the signal c is output as "H" when the counter value becomes "10100". Thereby "1" is output as the signal c every time the clock SCK is binary "10100", in other words, every time the signal is input 20 times in decimal.

As described above, the signal a (corresponding to a case of "L" when the phase difference signal is sampled by the reference clock), the signal b (corresponding to a case of "H" in the same situation), and the signal c (correction timing signal) are output from the first and second edge detection circuits 35 and 36 and the correction timing generation circuit 37 plus the third edge detection circuit 38.

FIG. 6 is a diagram depicting a configuration example of the subsequent stage portion of the difference detection circuit 30. The subsequent stage portion comprises an added value calculation circuit A38, arithmetic circuit 39, register 40 and decision circuit 41. These units constitute the counter circuit 200.

The output signals (signal a, signal b and signal c) are input to the added value calculation circuit A38. In the added value calculation circuit A38, weighting values "av" and "bv" for the signal a and signal b are input from "DMODE" at the left end. A weighting value "cv" for the signal c is input from "PHADOC" at the left end. For example, "av=+1", "bv=−3", and "cv=+12" are input.

The added value calculation circuit A38 outputs a corresponding weighting value when one of the signals, a, b and c to be input, is "H".

The arithmetic circuit 39 sequentially adds the output values from the added value calculation circuit A38. The added value is stored in the register 40 in the subsequent stage. And the stored value is output to the arithmetic circuit 39 again.

The decision circuit 41 decides whether the output value from the register 40 reached the upper limit or lower limit (see FIG. 2). In the decision circuit 41, thresholds to indicate the upper limit and lower limit are stored respectively, and a decision is made by comparing the thresholds with the output value of the register 40. In the case of the example in FIG. 6, "FLL=H" is output if the output value reached the upper limit, and "FLH=H" is output if it reached the lower limit. These values correspond to "H, L" of the output in FIG. 3.

If the output value does not reach the upper limit or lower limit, a logic corresponding to the output "EQ" (outputs are balanced, that is around a predetermined value "0") in FIG. 3, is output from the decision circuit 41.

If the weighting values "av" and "bv" match the appearance probabilities of "L" and "H" of the phase difference signal, the phase difference of the input clocks can be detected merely by using these values. If there is no match, the counter value gradually changes in a direction toward the upper limit or lower limit. By adding or subtracting the weighting value "cv" according to the appearance cycle (determined by mv) of "signal c", the counter value, which is changing upward or downward from the predetermined value "0", is moved back in the opposite direction, so as to transit around the predetermined value "0" ("EQ" is output from the decision circuit 41). In other words, the phase difference to be detected can be finely adjusted by the weighting value "cv". Further, the count value "mv" can also finely adjust. Since a phase difference can be roughly detected by the weighting values "av" and "bv", and fine adjustment can be performed using the weighting value "cv" and the count value "mv", the phase difference can be accurately detected. Instead of detecting the "EQ" state, the phase difference can also be detected by detecting the boundary of the input signal (av, bv, cv, mv) setting values so that FLL=H and FLH=H are switched.

FIG. 7 is a diagram depicting another configuration example of a first stage portion of the difference detection circuit 30. A main difference from FIG. 5 is that the inverting circuit 31 does not exist in the input side of the first flip-flop 32. The input of the first flip-flop 32 is fixed to the power supply voltage VDD, so the time difference, up to input of the phase difference signal CKT to the sampling FF, need not be considered. The rest of the operation is the same as FIG. 5, and the output signals (signal a, signal b, signal c) are output. The output signals a, b, c are input to the subsequent stage portion of the difference detection circuit 30 shown in FIG. 6, which operates in the same way as the above mentioned example.

Figure 8:
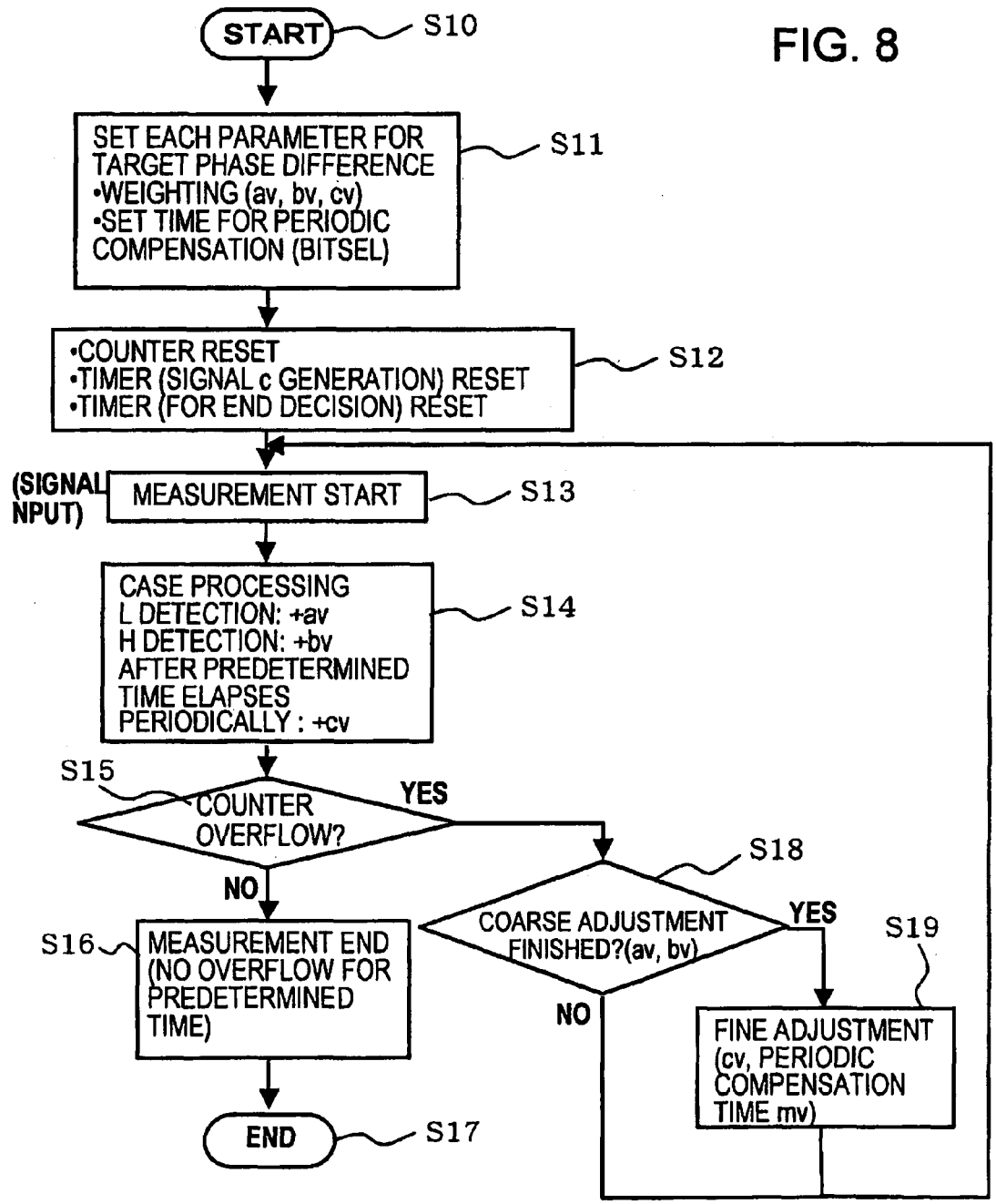
FIG. 8 is a flowchart of the general operation of the phase detection circuit.

Now the general operation of the phase detection circuit 1 will be described with reference to FIG. 8. When the processing is started (S10), each parameter is set for the target phase difference (S11).

The weighting values "av" and "bv" are set by being input in "DMODE", and the weighting value "cv" is set by being input in "PHADCD" (see FIG. 6). BITSEL, to indicate the time setting for periodic compensation (count value mv of the clock SCK to determined the generation cycle of the signal c), is input in "BITSEL" (see FIG. 5 and FIG. 7). "ACTEN" (see FIG. 5 and FIG. 7) is a signal to control ON/OFF of the phase decision function, and is generated from output FLL or FLH of the decision circuit 41. This is a signal for ending the phase decision operation when either FLL or FLH becomes H.

Then various circuits are reset (S12). In other words, the added value calculation circuit A38 and the arithmetic circuit 39 are reset (counter reset), the correction timing generation circuit 37 is reset (timer (for generating signal c) is reset), and the decision circuit 41 is reset (timer (for deciding termination) is reset).

Then the input clock is input, and measurement is started (S13). Based on the weighting values "av", "bv" and "cv" which were input, the arithmetic circuit 39 counts the number of "Hs" and "Ls" sampled from the phase difference signal using the reference clock (S14).

If the decision circuit 41 decides that an overflow did not occur as a result of counting (NO in S15), the measurement ends with no overflow during a predetermined time (S16), and the series of processings ends (S17). In this case, the phase difference determined from the weighting values "av", "bv" and "cv" which are set by the later mentioned expression matches the phase difference of the input clocks.

If overflow occurs (YES in S15), it is judged whether the weighting values "av" and "bv", which were set, will be adjusted (whether these values have been roughly adjusted for rough adjustment) (S18). In a case of a 2-bit "bv" value, this decision may be made based on whether all the bv values have tried as a simplified control flow.

If these weighting values have not been roughly adjusted (NO in S18), the processing returns to S13, and waits until the rough adjustment is completed (loop from NO in S18 to S13). If the phase difference between the two input clocks (CLK-1, CLK-2) is known roughly, the rough adjustment is unnecessary, and processing moves directly to S19.

If the weighting values "av" and "bv" are roughly adjusted (YES in S18), the weighting value "cv" or the value "mv" is input separately (S19), the processing moves to S13 again, and measurement is performed along with the separately input weighting values "av" and "bv".

Thus the present phase difference detection circuit 1 can detect the phase difference of the input clocks accurately by inputting the weighting values again based on the output logic of the decision circuit 41, using the reference clock of which frequency is slower than the input clocks.

For example, when the output logic of the decision circuit 41 is "EQ", (neither FLL=H nor FLH=H is output), the weighting values "av", "bv" and "cv" or the value "mv" which were input correspond to the phase difference of the input clocks, so the phase difference can be accurately detected using these values. The phase difference "k", when the output logic of the decision circuit 41 is "EQ", is given by the following expression.

When the first stage portion of the difference detection circuit 30 in FIG. 5 is used, $$\left(\frac{k}{360} * av + \frac{(360-k)}{360} * bv\right) * mv + cv = 0 \quad \text{[Expression 1]}$$

$$\therefore k = 360 * \frac{-\left(bv + \frac{cv}{mv}\right)}{av - bv}$$

the above expression is established.

When the first stage portion of the difference detection circuit 30 in FIG. 7 is used:

$$\left(\frac{k}{360} * av + bv\right) * mv + cv = 0 \quad \text{[Expression 2]}$$

$$\therefore k = 360 * \frac{-\left(bv + \frac{cv}{mv}\right)}{av}$$

Here "mv" is a count value of the circuit 37 when the signal c is output. According to the above expression, the "k" corresponds to the period of L level of the phase difference signal CKT. When the period of H level is measured, "av" and "bv" should be exchanged in the above expression.

The phase differences k calculated by the above expressions as well show that the phase differences of the input clocks can be accurately detected using a reference clock having a slow frequency.

(Example of Constructing the Counter Circuit 200 Using an Analog Circuit)

Figure 9:
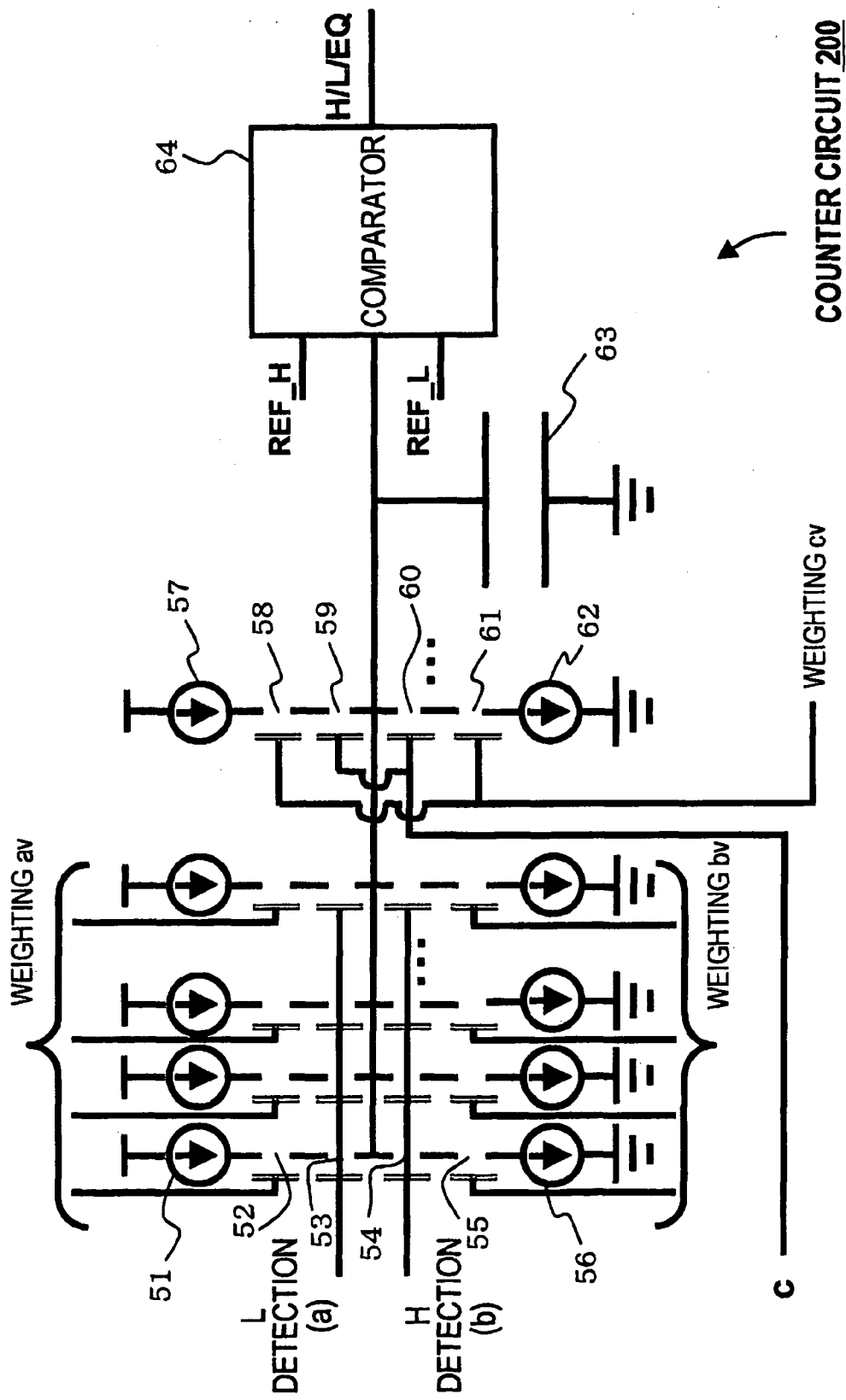
FIG. 9 shows a configuration example of a counter circuit.

Now an example of constructing the counter circuit 200, which is the subsequent stage portion of the difference detection circuit 30 using an analog circuit, will be described with reference to FIG. 9 and FIG. 10. FIG. 9 shows a configuration example of the counter circuit 200 in such a case.

As FIG. 9 shows, four transistors 52 to 55 are connected in a series, and a constant current sources 51 and 56 are connected to both ends thereof. An output side of one constant current source 56 is grounded. This transistor group is connected in parallel, so that the weighting values "av" and "bv" for the "signal a" and "signal b" can be input. In the example of FIG. 9, the weighting value "av" controls a gate of the transistors 52 or the like, and selects a number of transistors to be active, out of the transistor group connected in parallel. In the same way, the weighting value "bv" controls a gate of the transistors 55 or the like, and selects a number of transistors to be active, out of the transistor group connected in parallel.

For the "cv signal", on the other hand, four transistors 58 to 61 are connected in series, and constant current sources 57 and 62 are connected to both ends thereof in a similar manner. An output side of one constant current source 62 is grounded. This transistor group is connected in parallel. "Signal c" is input to the gate of each transistor 59 and 60, and the weighting value "cv" for the "signal c" controls the gate of each transistor 58, 61 or the like, and selects the top or bottom of the transistor group which is connected in parallel with 58 and 61, and selects a number of transistors to be active, out of the transistor group.

The output values are stored in a capacitor 63, and are compared with the thresholds (REF_H, REF_R) by a comparator 64. The thresholds (REF_H, REF_R) correspond to the upper limit and lower limit of the counter value.

Figure 10:
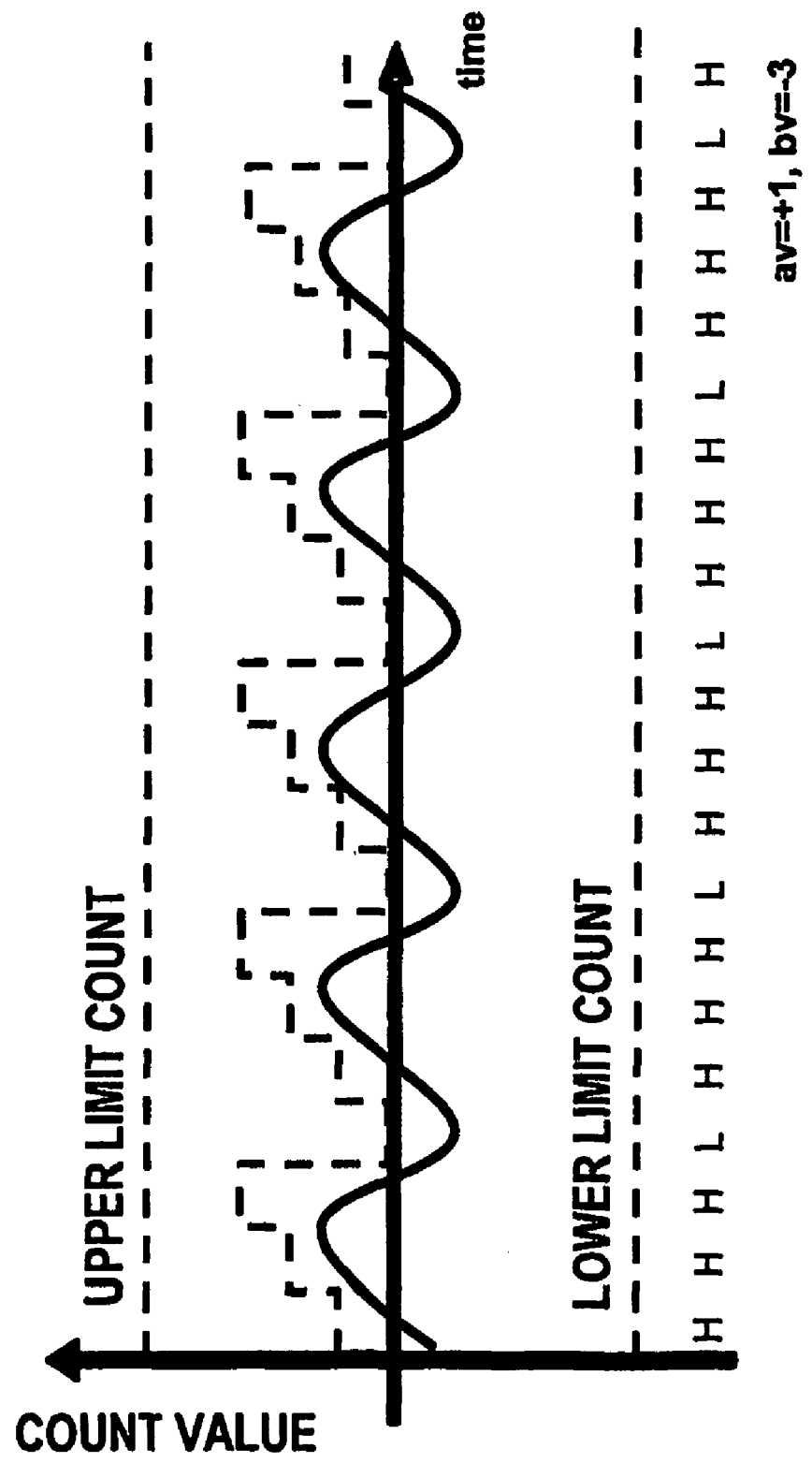
FIG. 10 is a diagram depicting a transition of a count value.

FIG. 10 is a diagram depicting a transition (solid line) of a count value by the counter circuit 200. In this example, the phase difference of the input clocks and the weighting values "av", "bv" and "cv" match. As a result, the count value transits within the upper limit count and lower limit count.

In the present example as well, the first stage portion of the counter circuit 200 can use the first stage portion of the difference detection circuit 30 shown in FIG. 5 and FIG. 7, and can detect the phase difference of the input clocks accurately by inputting the weighting values again based on the output logic of the decision circuit 41, using the reference clock of which frequency is slower than the input clocks, just like the above mentioned example.

(Phase Difference Adjustment Unit Using Phase Difference Detection Circuit 1)

Figure 11:
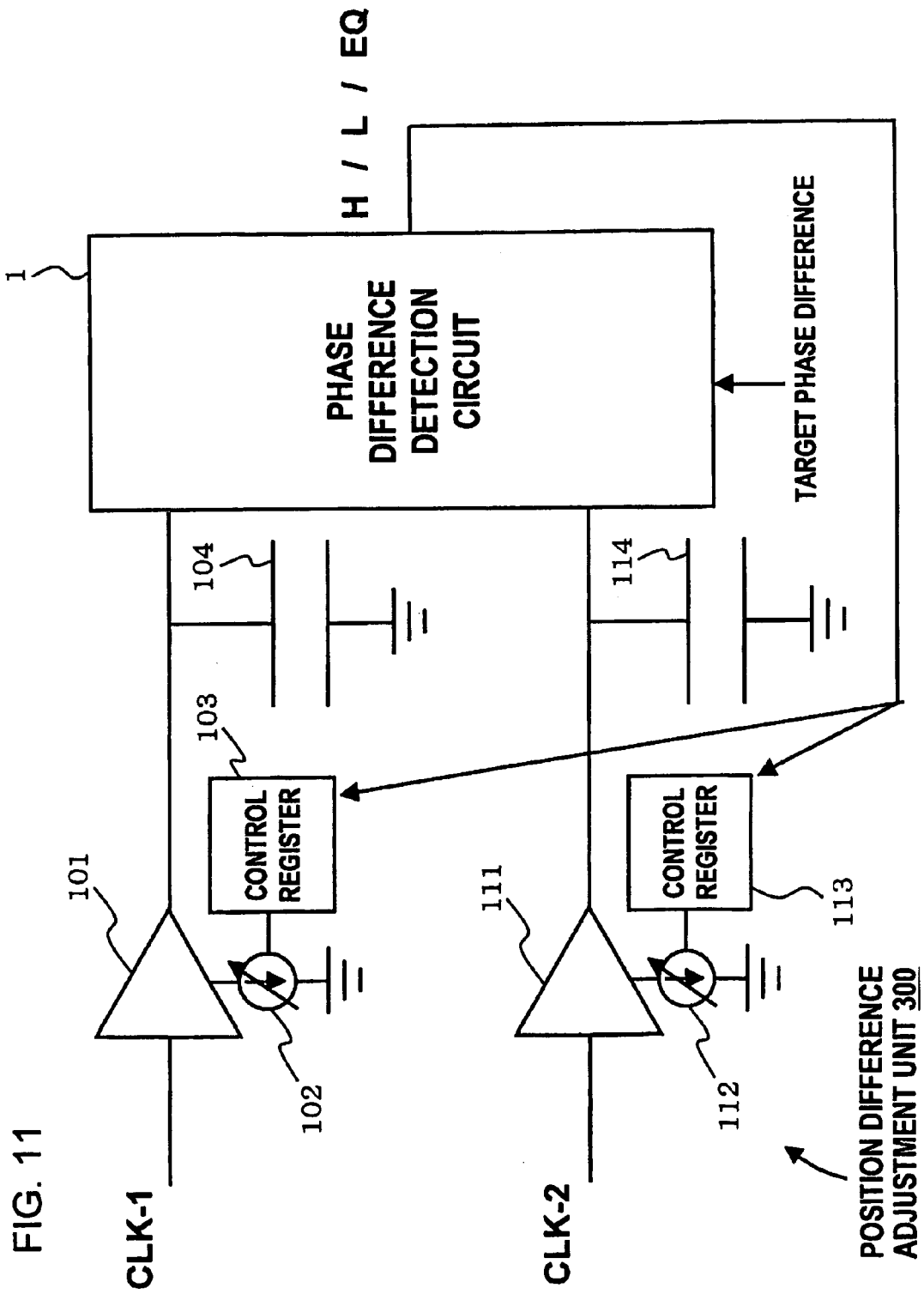
FIG. 11 shows a configuration example of the phase difference adjustment unit.

Now a phase difference adjustment unit, in which input clocks automatically follow up a target phase difference using the above mentioned phase difference detection circuit 1, will be described. FIG. 11 shows a configuration example thereof, FIG. 12A and FIG. 12B show an operation example, and FIG. 13 shows a flow chart.

As FIG. 11 shows, a phase difference adjustment unit 300 has a first buffer 101, a first variable current source 102, a first control register 103, and a first capacitor 104 for the input clock CLK-1, and has a second buffer 111, a second variable current source 112, a second control register 113, and a second capacitor 114 for the input clock CLK-2, and the phase difference detection circuit 1 is connected to the subsequent stage of these composing elements.

The output of the phase difference detection circuit 1 is input to the first and second control registers 103 and 113. The first and second control registers 103 and 113 increase/decrease the current values of the first and second variable current sources 102 and 112 according to the output of the phase difference detection circuit 1.

Figure 12A:
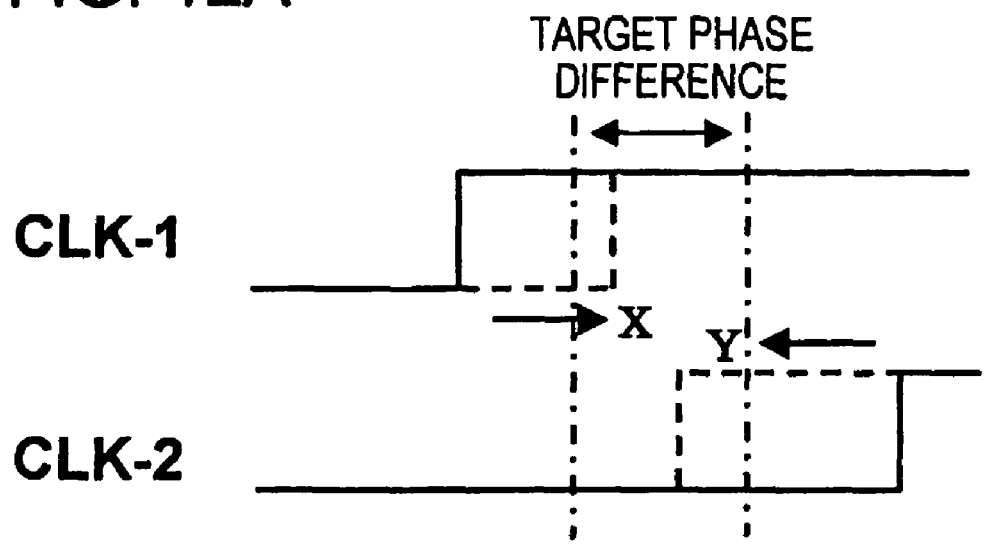
FIG. 12A and FIG. 12B show an operation example in the phase different adjustment unit.
Figure 12B:
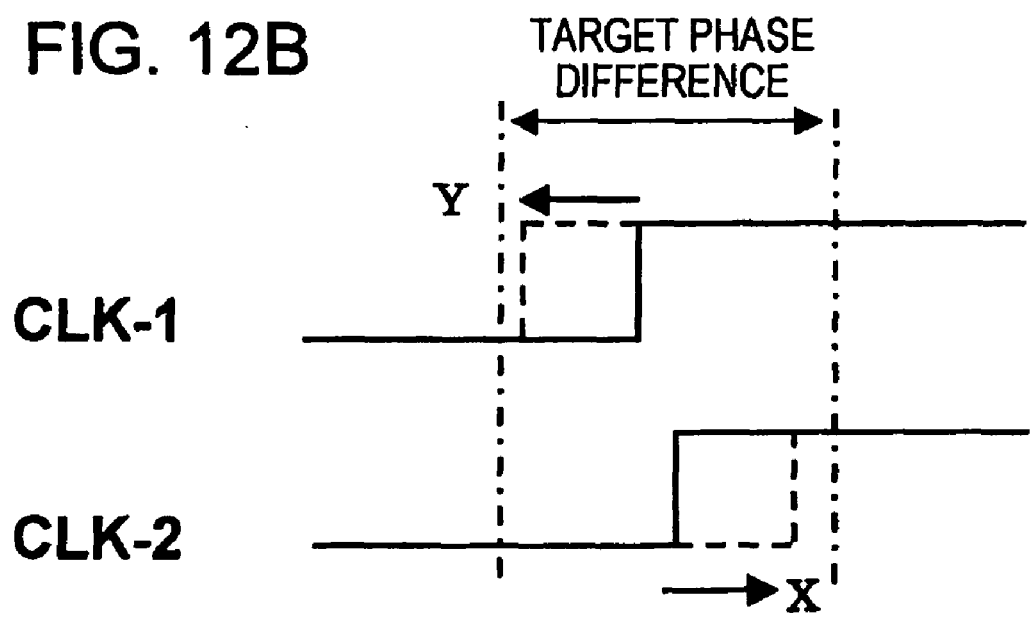
Figure 13:
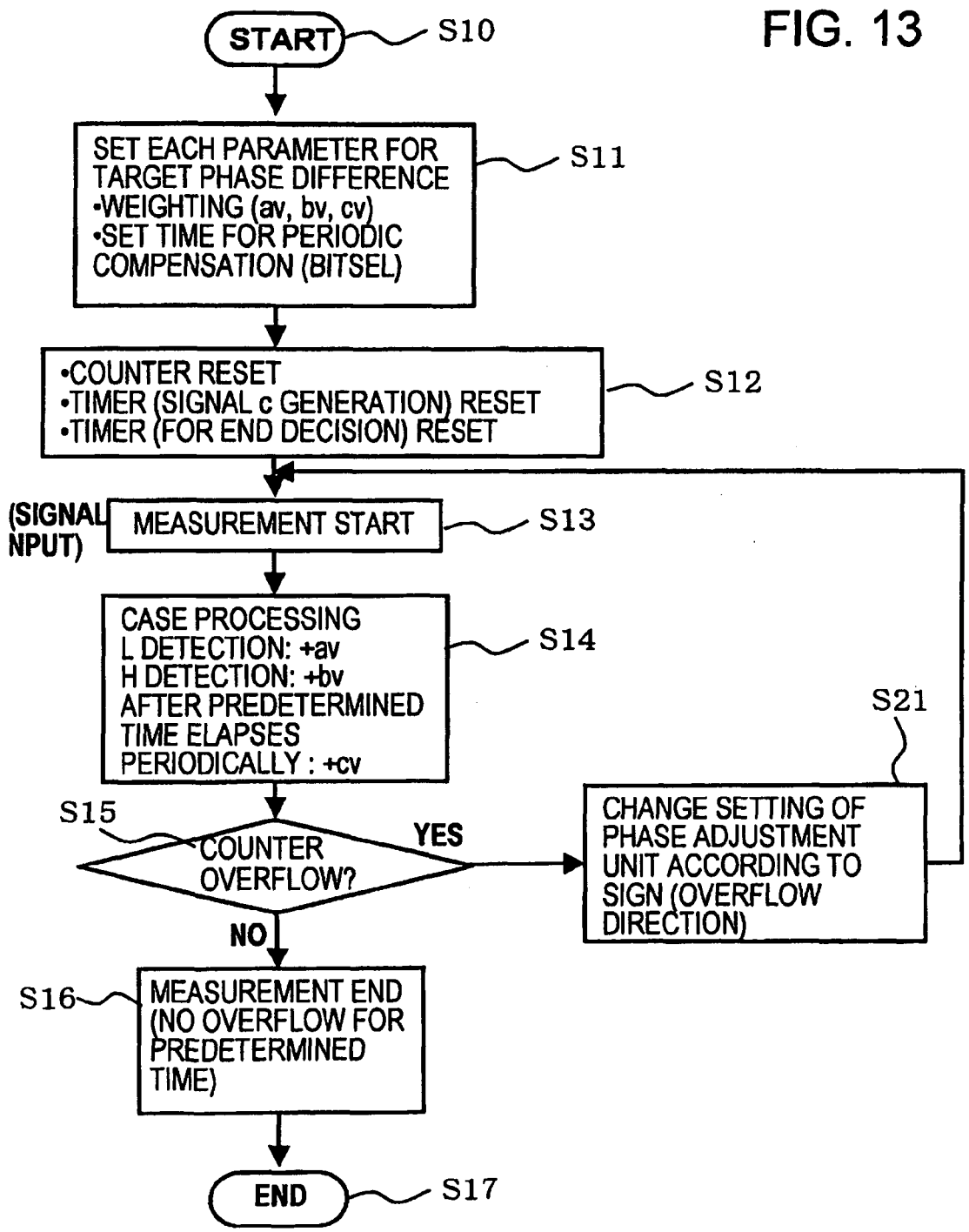
FIG. 13 shows a flow chart depicting an operation of a phase difference adjustment unit.

For example, consider the case of FIG. 12A. If "H" is output from the phase difference detection circuit 1 for the two input clocks CLK-1 and CLK-2, it means that the values set for the weighting values "av", "bv" and "cv" do not match with the phase difference of the input clocks CLK-1 and CLK-2. In this case, the phase difference of the input clocks CLK-1 and CLK-2 deviated too much from the target phase difference, which is set by the weighting values "av", "bv" and "cv". For example, the deviation is as shown in FIG. 12A.

When "H" is output from the phase difference detection circuit 1, the first control register 103 decreases the current of the first variable current source 102, so that the delay of the phase of the clock CLK-1, which is output from the first buffer 101, is increased (shifted in the X direction).

On the other hand, the second control register 113 increases the current of the second variable current source 112 so that the delay of the phase of the clock CLK-2, which is output from the second buffer 111, is decreased (shifted in the Y direction).

In other words, if "H" is output from the phase difference detection circuit 1, the first control register 103 shifts the clock CLK-1 in the "X direction", and the second control register 113 shifts the clock CLK-2 in the "Y direction", as shown in FIG. 12A. By shifting the two input clocks in a direction that approaches each other, the two input clocks CLK-1 and CLK-2 can match the target phase difference. This means that the phase difference of the two input clocks CLK-1 and CLK-2 can automatically follow up the target phase difference.

FIG. 12B shows an example when "L" is output from the phase difference detection circuit 1, and the first and second control registers 103 and 113 perform control opposite of the above example, so that CLK-1 and CLK-2, of which phase difference of the input clocks is much smaller than the target phase difference, are shifted in a direction where the phase difference thereof increases, and can automatically follow up the target phase difference in the same manner.

FIG. 13 is a flow chart depicting a processing example of the phase difference adjustment unit 300. This flow chart is roughly the same as FIG. 8, and a difference is that the setting of the phase difference adjustment unit 300 is changed according to the signal ("H" or "L") when an overflow of the counter occurs (when "H" or "L" is output from the phase difference detection circuit 1) (S21). "changing the setting" refers to the above mentioned control of the first and second variable current sources 102 and 112 by the first and second control registers 103 and 113.

In this way, in the phase difference adjustment unit 300, the first and second control registers 103 and 113 increase/decrease the first and second variable current sources 102 and 112 using the output of the phase difference detection circuit 1, whereby the phase difference of the input clocks CLK-1 and CLK-2 can automatically follow up the target phase difference.

For example, when the phase difference of the signal I and signal Q of the transferred digital video signals does not match the "90°" target phase difference, the phase difference can roughly match 90° by using the phase difference adjustment unit 300 shown in FIG. 11.

In the above mentioned example, the phase difference adjustment unit 300 controls the phase difference of the input clocks to be decreased by making the input clocks approach each other if "H" is output from the phase difference detection circuit 1, and controls the phase difference thereof to be increased by making the input clocks apart from each other if "L" is output. Needless to say, these controls may be reversed.

(Reference Clock Dividing Adjustment Function)

The dividing adjustment function for dividing a reference clock will now be described with reference to FIG. 14 to FIG. 17.

In both of the above mentioned examples, the frequency of the reference clock is not especially restricted, as long as it is slower than the frequencies of the input clocks, and the frequency relationship of the reference clock and input clocks is arbitrarily chosen.

For example, if the frequency of the phase difference signal is the same as triple that of the frequency of the reference clock, sampling in one cycle ends with three points, and this sampling is simply repeated thereafter. To detect the phase difference, the phase accuracy is not very good if the number of sampling points is only 3.

Hence the number of sampling points should be increased to improve phase accuracy. For example, when the cycle of the reference clock (Tc) is the same as the cycle of the phase difference signal (Tp), that is M+N/360 (M is an integer, and N/360 is a decimal number which does not exceed 1), the signal "H" or "L" is detected at the phase of the reference clock N°, 2N° and 3N° . . . , with respect to the cycle of the phase difference signal. If 2N or 3N exceeds 360°, the phase of the reference clock is a remainder when 2N or 3N is divided by 360° (e.g. if M=1 and N=7, then 0, 7 (367), 14 (734), 21 (1101), 28 (1468), 35 (1835) . . . ).

If the value N is a small value, such as 1 or 2, for example, it is a case when "H" is detected at 100 sampling points continuously, and an overflow occurs to the counter circuit 200. Even if the phase difference of the input clocks can be accurately detected for a long time, an overflow occurs based on the decision over a short time, and the setting of the phase difference is forced to be changed (change of the weighting values "av", "bv" and "cv").

Figure 14:
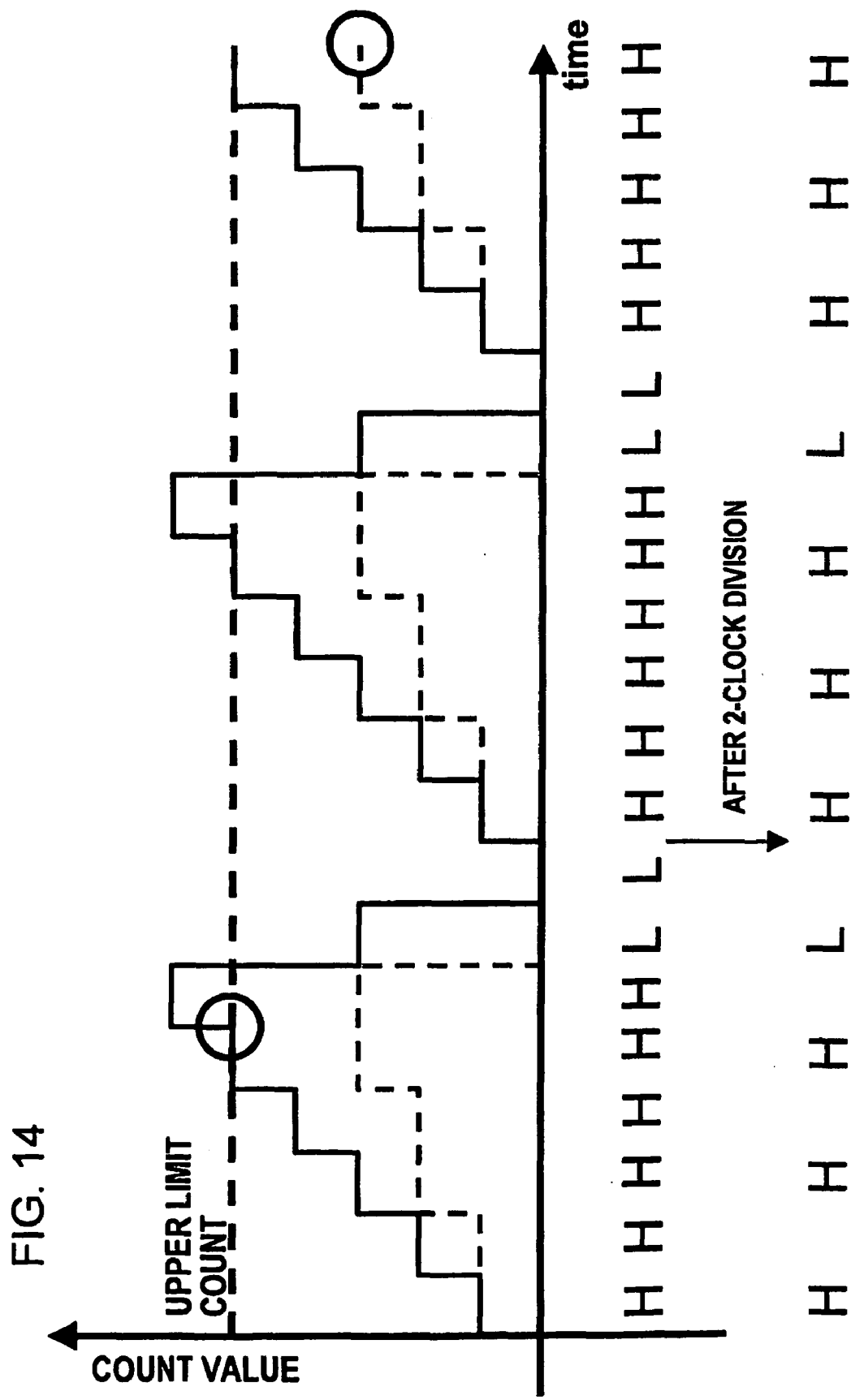
FIG. 14 shows a diagram depicting a transition of a count value.

For example, if "H" is continuously detected at the sampling points shown by the solid line in FIG. 14, the upper limit count is exceeded, and as a result the determination of the phase difference through changing the weighting values cannot be possible.

Therefore according to the present embodiment, a number of "Hs" or "Ls" which appear continuously is counted, and if this count value exceeds the maximum allowable continuous appearance count which is determined depending on the counter size of the phase difference detection circuit 1, the reference clock is divided, so that the number of sampling points is decreased to decrease the continuous appearance count of "H" or "L", preventing an overflow. In the above mentioned example, the result becomes 0, 14 (734), 28 (1468), 42 (2202) . . . ). AS FIG. 14 shows, if the maximum allowable continuous appearance count is exceeded, the reference clock is divided into 2, so that the number of sampling points is decreased by half, and an overflow is prevented. The number of sampling points is limited, but the phase difference of the input clocks can be detected accurately.

Figure 15:
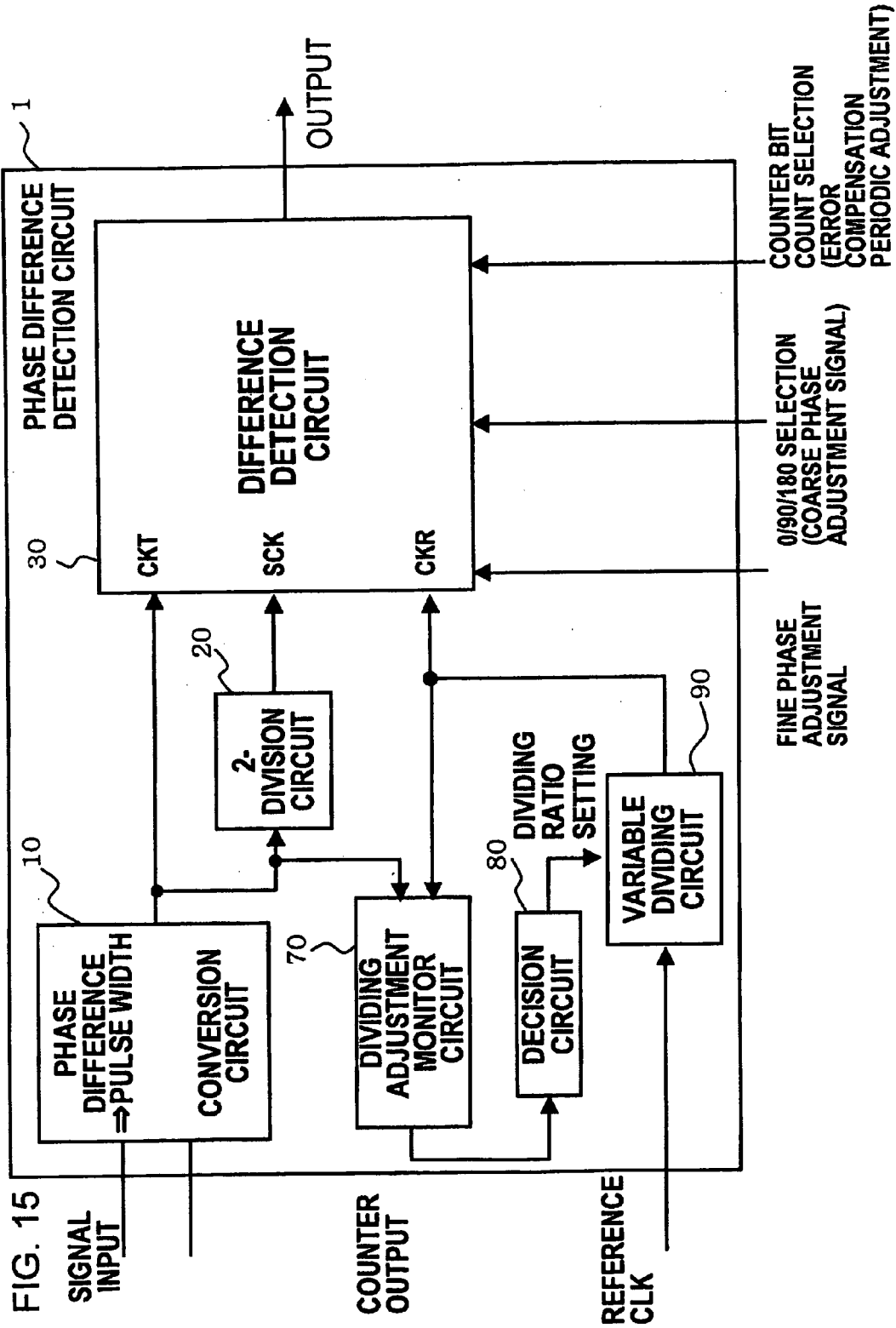
FIG. 15 is a diagram depicting a configuration example of the phase difference detection circuit to which the phase adjustment function is added.

FIG. 15 is a diagram depicting a configuration example of the phase difference detection circuit 1 to which the reference clock dividing adjustment function is added. The difference from the phase difference detection circuit 1 shown in FIG. 3 is that a dividing adjustment monitor circuit 70, a dividing ratio decision circuit 80 and a variable dividing circuit 90 are added.

The dividing adjustment monitor circuit 70 counts the continuous appearance of "H" or "L" of the phase difference signal. This will be described in detail later. The dividing ratio decision circuit 80 decides whether the counted continuous appearance count of "H" or "L" exceeds the maximum allowable continuous appearance count, and if the count is exceeded (if an overflow occurred), the dividing ratio decision circuit outputs an increased dividing ratio. Based on this dividing ratio, the variable dividing circuit 90 divides the reference clock.

Figure 16:
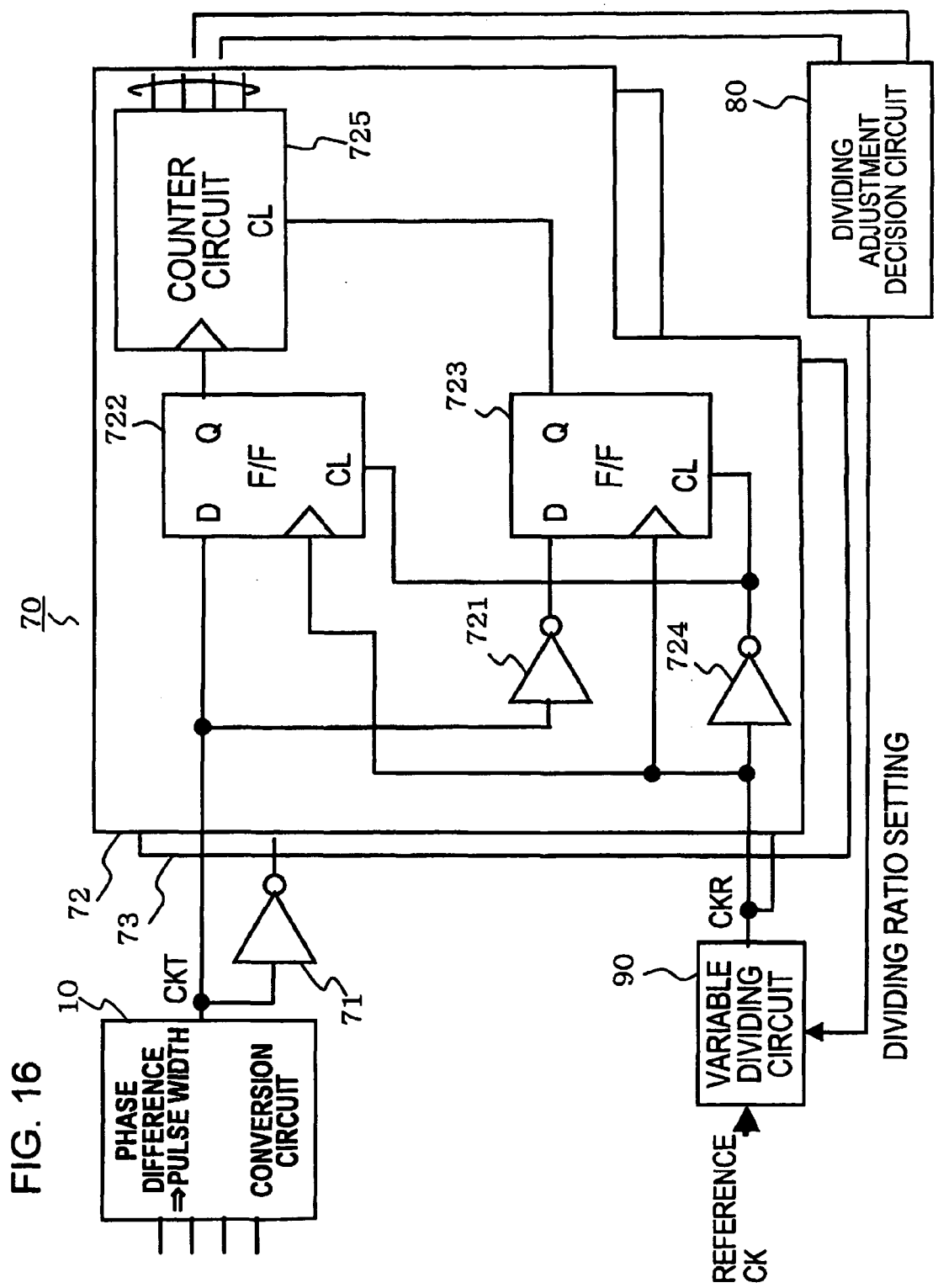
FIG. 16 is a diagram depicting a configuration example of the dividing adjustment monitor circuit.

FIG. 16 is a diagram depicting a detailed configuration example of the dividing adjustment monitor circuit 70. The dividing adjustment monitor circuit 70 comprises a dividing adjustment inverting circuit 71, first monitor circuit 72 and second monitor circuit 73. The first monitor circuit 72 counts the continuous appearance count of "H" of the phase difference signal, and the second monitor circuit 73 counts the continuous appearance count of "L" of the phase difference signal.

The first monitor circuit 72 has a first inverting circuit 721, two flip-flops 722 and 723, second inverting circuit 724 and first counter circuit 725.

The "H" level of the phase difference signal is input from the flip-flop 722 to the first counter circuit 725, and the continuous appearance count of "H" of the phase difference signal is counted by the first counter circuit 725. The "H" level of the phase difference signal is also inverted by the first inverting circuit 721, to become "L" level, and is input to "CL" of the first counter circuit 725 via the flip-flop 723.

When the signal level to be input to "CL" becomes "H", the first counter circuit 725 ends the counting, and the count value up to this point is output. In the first counter circuit 725, the continuous appearance count of "H" can be counted when the phase difference signal is "H", but when the phase difference signal becomes "L", the counted value is cleared since the signal level to be input to "CL" becomes "H". Therefore in the first monitor circuit 72, the continuous appearance count of "H" of the phase difference signal can be counted.

In the second monitor circuit 73, on the other hand, which has a similar configuration as the first monitor circuit 72, the continuous count of "L" of the phase difference signal can be counted using the dividing adjustment inverting circuit 71 in the input stage.

The continuous appearance counts (count values) of "H" and "L" of the phase difference signal are output to the dividing ratio decision circuit 80, and are compared with the maximum allowable continuous appearance count. If one of the continuous appearance counts exceeds the maximum allowable continuous appearance count, an increased dividing ratio is output. For example, if the current dividing ratio is "1" (that is, if the reference clock is not divided), a dividing ratio of "2" is output.

The variable dividing circuit 90 divides the reference clock based on the dividing ratio from the dividing ratio decision circuit 80, and outputs the divided reference clock.

Figure 17:
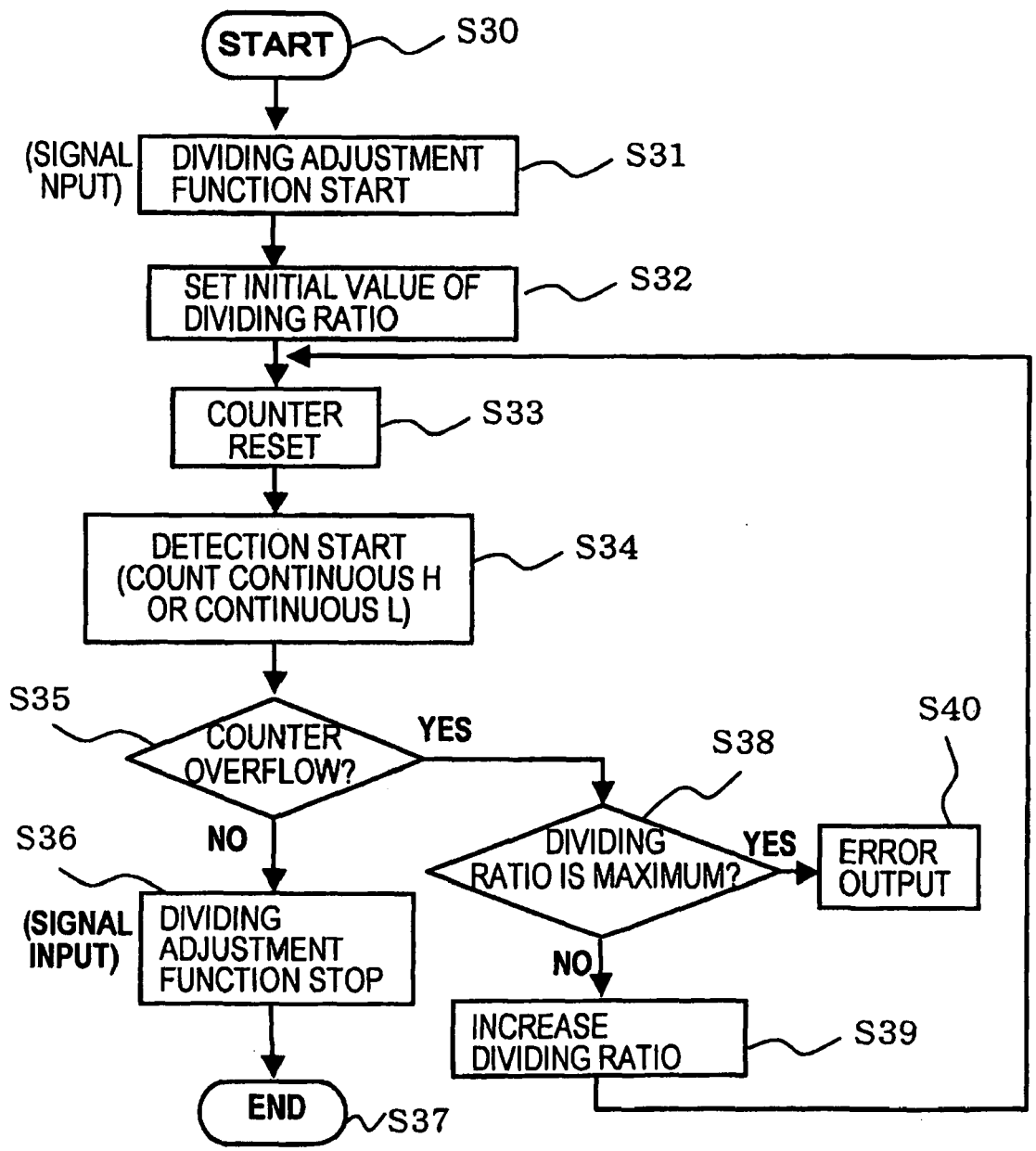
FIG. 17 is a flow chart depicting an operation of the phase difference detection circuit.
Figure 19A:
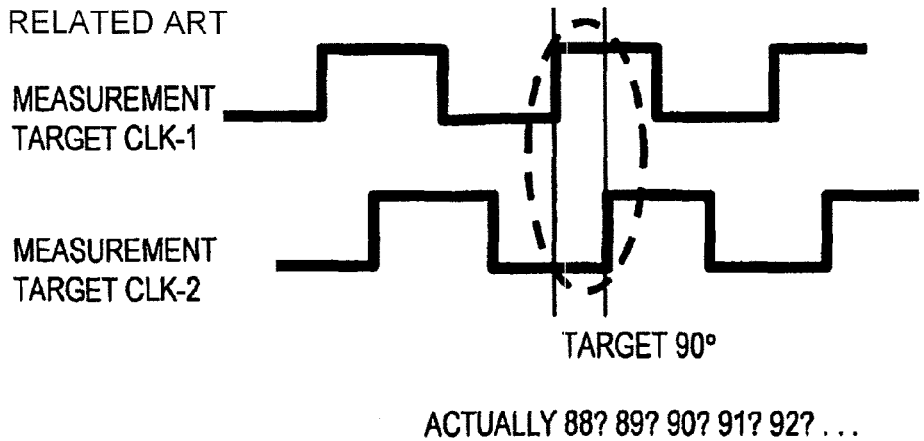
FIG. 19A and FIG. 19B are diagrams depicting an example of prior art.
Figure 19B:
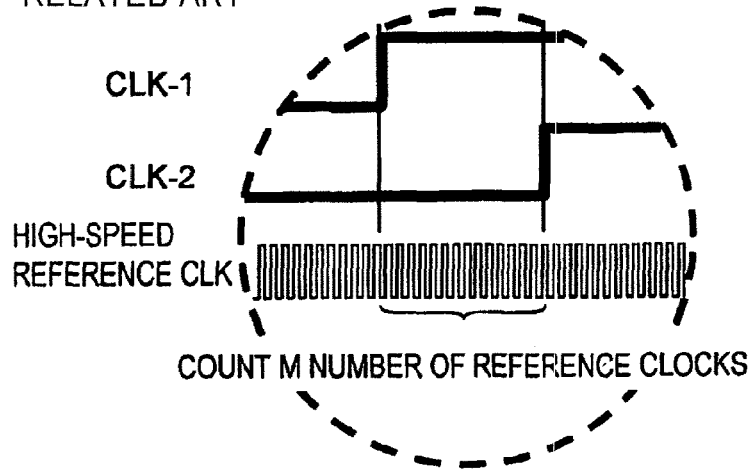
Figure 20:
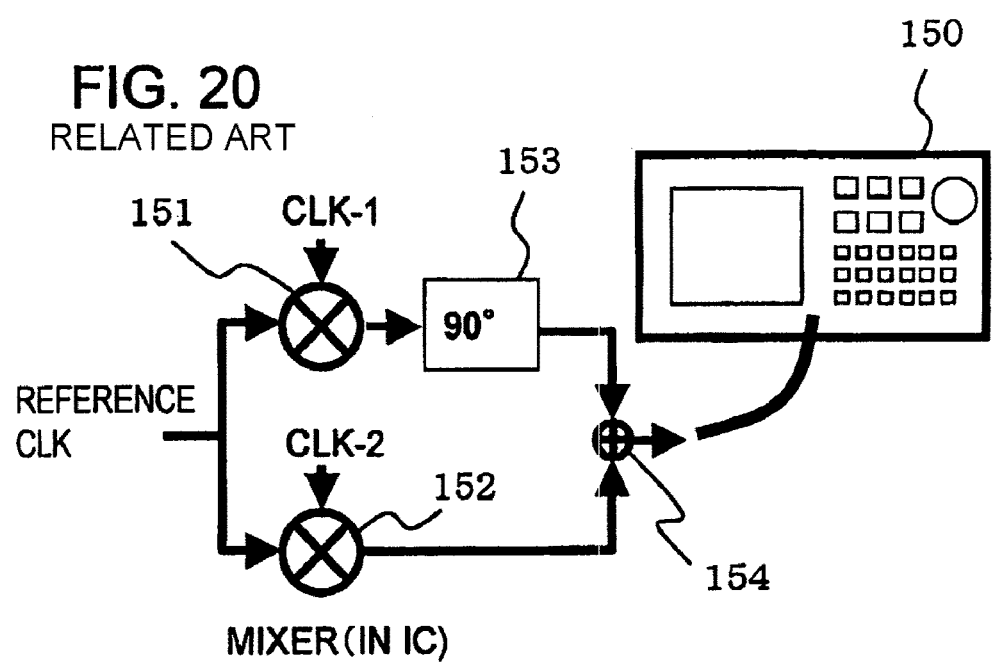
FIG. 20 is a diagram depicting an example of prior art.

FIG. 17 is a flow chart depicting an operation of the phase difference detection circuit 1 where the above mentioned dividing adjustment function is added.

When the processing starts (S30), the phase difference detection circuit 1 starts the dividing adjustment function (S31). And the variable dividing circuit 90 divides the reference clock using the initial value of the dividing ratio (S32). For example, the initial value is stored in the variable dividing circuit 90, and this processing is executed by reading this initial value.

Then the counter circuit 725 or the like in the first and second monitor circuit 72 and 73 are reset (S33), and the continuous appearance counts of "H" and "L" of the phase difference signal are counted by the first and second monitor circuits 72 and 73 (S34).

If the dividing ratio decision circuit 80 decides that an overflow did not occur (the count values did not exceed the maximum allowable continuous appearance count) (NO in S35), the dividing adjustment function stops (S36), and a series of processings ends (S37).

If it is decided that an overflow occurred, on the other hand (one of the count values exceeded the maximum allowable continuous appearance count) (YES in S35), it is judged whether the dividing ratio is the maximum dividing ratio or not (S38).

If the maximum dividing ratio is not exceeded (NO in S38), the dividing ratio is increased, and the reference clock is divided by the increased ratio (S39), and processing moves back to S33 again, and is repeated.

If the maximum dividing ratio is exceeded (YES in S38), on the other hand, the dividing ratio can no longer be increased, so an error is output, and processing ends (S40).

For example, the reference clock is divided by "2", as shown by the dotted line in FIG. 14, then the counter in the difference detection circuit 30 does not overflow, and the phase difference of the input clocks can be accurately detected.

(Input Clock Duty Measurement)

Now the input clock duty measurement function in the phase difference-pulse width conversion circuit 10 will be described with reference to FIGS. 18A to 18C.

FIG. 18B is an example of constructing the phase difference-pulse width conversion circuit 10 using an OR circuit 15, and FIG. 18C is an example of constructing it using an AND circuit 16.

As the top row in FIG. 18A shows, if the phase difference of the two input clocks (duty ratio is both "50%") is "90°", the phase difference signal of which pulse width is "0.75" is output from the OR circuit 15. The phase difference signal of which pulse width is "0.25" is output from the AND circuit 16. The phase difference-pulse width conversion circuit 10 can be constructed simply by using an OR circuit 15 or an AND circuit 16, although this may differ depending on the configuration of the circuit in the subsequent stage.

As the middle row in FIG. 18A shows, if the phase difference of the input clocks is "180°", the phase difference signal having a pulse with of "1" is output from the OR circuit 15, and the phase difference signal having a pulse width of "0" is output from the AND circuit 16 respectively.

Now a case of fixing one of the inputs to "H" in the AND circuit 16 (phase difference-pulse width conversion circuit 10), as shown in the bottom row in FIG. 18A, is considered. When the other input is the input signal which becomes "H" at phase "0°" (duty ratio of "50%"), the phase difference signal of which pulse width is "0.5" is output from the AND circuit 16. In other words, the phase difference signal of which pulse width is the same as the duty ratio of the other input is output. Therefore if the phase difference-pulse width conversion circuit 10 is constructed using the AND circuit 16, and one of the inputs is fixed to "H", then the duty of the output signal thereof (phase difference signal) can be detected. Just in the same way, the duty of the input signal can be detected, even if one of the inputs is fixed to "L" in case of OR circuit 15.

(Other)

The present phase difference detection circuit 1 can be used for a radio LAN device, a TV and a TV tuner which receive digital broadcasting. The present phase difference detection circuit can also be used for a personal computer that encloses a radio LAN and a portable telephone.

INDUSTRIAL APPLICABILITY

The present invention can be suitably used for an inter-clock phase detector integrated on a semiconductor.

The invention claimed is:

1. A phase difference detector for detecting a phase difference between input clocks which both have a same first frequency, comprising:

a pulse width conversion unit for converting the input clocks into a phase difference signal indicating by a pulse width a phase difference between the input clocks; and a counter unit which samples a level of the phase difference signal using a reference clock having a second frequency which is slower than the first frequency, and counts the number of levels of the phase difference signal using a first weighting according to the sampled level of the phase difference signal, wherein when a count value of the counter unit transits in a predetermined range, the phase difference between the input clocks is detected according to the first weighting.

2. The phase difference detector according to claim 1, wherein the pulse width conversion unit comprises a NOT circuit which inverts a logic of one of the input clocks, and an AND circuit which computes a logic AND of the one of the input clocks inverted by the NOT circuit and the other of the input clocks, and output of the AND circuit is the phase difference signal.

3. The phase difference detector according to claim 1, wherein the counter unit calculates the count value using a second weighting, which corrects the count value, and the first weighting, and an adjusted phase difference between the input clocks is detected according to the second weighting.

4. The phase difference detector according to claim 1, wherein the counter comprises sampling units each of which samples a level of the phase difference signal respectively, and a fixed potential in place of the phase difference signal is input to one of the sampling units.

5. The phase difference detector according to claim 1 or claim 3, wherein the counter unit comprises a plurality of transistors, a constant current source and a comparator, and the first or second weighting is input by the plurality of transistors and the constant current source and the count value is output, and the comparator outputs a value to show whether the count value transits within the predetermined range.

6. The phase difference detector according to claim 1, further comprising:

a phase adjustment unit which adjusts a phase difference of the input clocks to be a target phase difference according to an output of the counter unit.

7. The phase difference detector according to claim 1, further comprising:

a dividing adjustment unit which counts a continuous appearance count of one of the levels of the phase difference signal, and divides the reference clock when the continuous appearance count value exceeds a maximum allowable continuous appearance count.

8. The phase difference detector according to claim 1, wherein the pulse width conversion unit comprises an AND circuit to which the input clocks are input and which computes a logic AND, and a fixed level is input to one of inputs of the AND circuit.

9. A phase difference detection method for detecting a phase difference between input clocks which both have a same first frequency, the method comprising:

converting the input clocks into a phase difference signal indicating by a pulse width a phase difference between the input clocks;

sampling a level of the phase difference signal using a reference clock having a second frequency which is slower than the first frequency and counting the number of levels of the phase difference using a first weighting according to the sampled level of the phase difference signal; and detecting the phase difference between the input clocks according to the first weighting when a counted count value transits within a predetermined range.

* * * * *